(12) United States Patent
Lee et al.

(10) Patent No.: US 12,740,469 B2
(45) Date of Patent: Sep. 15, 2026

(54) SEMICONDUCTOR DEVICE AND METHOD OF FORMING AN ANTENNA-IN-PACKAGE STRUCTURE

(71) Applicant: JCET STATS ChipPAC Korea Limited, Incheon (KR)

(72) Inventors: SeungHyun Lee, Incheon (KR); HeeSoo Lee, Incheon (KR); YongMoo Shin, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 434 days.

(21) Appl. No.: 18/357,733

(22) Filed: Jul. 24, 2023

(65) Prior Publication Data

US 2025/0038058 A1 Jan. 30, 2025

(51) Int. Cl.
*H10W 74/10* (2026.01)
*H01Q 1/22* (2006.01)
(Continued)

(52) U.S. Cl.
CPC ........ *H10W 74/114* (2026.01); *H01Q 1/2283* (2013.01); *H10W 40/10* (2026.01);
(Continued)

(58) Field of Classification Search
CPC ............ H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 23/31; H01L 23/3121; H01L 23/3135; H01L 23/3185; H01L 23/3157; H01L 21/56; H01L 21/563; H01L 21/568;
(Continued)

(56) References Cited

U.S. PATENT DOCUMENTS 7,480,153 B2 * 1/2009 Kong .................. H05K 1/0218 361/818
10,734,704 B2 8/2020 Ho et al.
(Continued)

OTHER PUBLICATIONS

Park, YeJin, JCET STATS ChipPAC Korea Limited, "Semiconductor Device and Method of Forming an Antenna-in-Package Structure" U.S. Appl. No. 18/190,047, filed Mar. 24, 2023.

*Primary Examiner* — Wael M Fahmy
*Assistant Examiner* — Quinton A Brasfield
(74) *Attorney, Agent, or Firm* — Brian M. Kaufman; Robert D. Atkins; PATENT LAW GROUP: Atkins & Associates, P.C.

(57) ABSTRACT

A semiconductor device has a substrate including an antenna formed in a first area of the substrate. A first electrical component is disposed over a second area of the substrate. A conductive pillar is disposed on the substrate adjacent to the first electrical component. A second electrical component is disposed on the conductive pillar and over the first electrical component. An interconnect structure is disposed over a third area of the substrate. A first encapsulant is deposited over the first electrical component and interconnect structure. A second encapsulant is deposited over the second electrical component. A third encapsulant is disposed over the antenna. The third encapsulant includes a higher dielectric constant than the first encapsulant and second encapsulant.

24 Claims, 29 Drawing Sheets

(51) Int. Cl.

| | |
|---|---|
| ***H10W 40/10*** | (2026.01) |
| ***H10W 42/20*** | (2026.01) |
| ***H10W 44/20*** | (2026.01) |
| ***H10W 74/01*** | (2026.01) |
| ***H10W 90/00*** | (2026.01) |

(52) U.S. Cl.
CPC .......... *H10W 42/20* (2026.01); *H10W 44/20* (2026.01); *H10W 74/01* (2026.01); *H10W 74/121* (2026.01); *H10W 90/00* (2026.01); *H10W 90/724* (2026.01)

(58) Field of Classification Search
CPC ......... H01L 23/5389; H01L 2223/6677; H01L 23/66; H01L 23/552; H05K 1/185; H10W 90/10; H10W 90/15; H10W 90/155; H10W 90/723; H10W 90/725; H10W 90/727; H10W 90/729; H10W 90/733; H10W 90/735; H10W 90/737; H10W 90/739; H10W 90/753; H10W 90/755; H10W 90/757; H10W 90/759; H10W 74/00–481; H10W 76/60–67; H10W 42/20–287; H10W 42/121; H10W 72/823; H10W 42/25; H10W 42/271; H10W 42/273; H10W 42/60; H10W 42/80; H10W 44/20; H10W 44/248; H10F 39/8067; H10F 77/413; H10F 77/42; H10F 77/48–488
See application file for complete search history.

(56) References Cited

U.S. PATENT DOCUMENTS

| | | | | |
|---|---|---|---|---|
| 11,095,037 | B2 | 8/2021 | Kim et al. | |
| 2019/0103365 | A1* | 4/2019 | Singh .................... | H10W 42/20 |
| 2021/0257745 | A1* | 8/2021 | Liao ......................... | H01Q 1/48 |
| 2021/0313283 | A1* | 10/2021 | Wilson .................. | H10W 44/20 |
| 2022/0246533 | A1 | 8/2022 | Cho et al. | |
| 2022/0375884 | A1 | 11/2022 | You | |
| 2023/0050884 | A1* | 2/2023 | Lee ....................... | H10W 42/20 |
| 2023/0230856 | A1* | 7/2023 | Kim ...................... | H10W 42/20<br>257/659 |
| 2023/0319977 | A1* | 10/2023 | Sato ..................... | H05K 1/0216<br>361/728 |
| 2023/0402397 | A1* | 12/2023 | Moon ................... | H10W 42/20 |
| 2024/0283132 | A1* | 8/2024 | Yan ...................... | H01Q 1/2283 |

* cited by examiner 120
126c
124
122
126b
124
122
124
122
126a
128
128
124
122
124
129
124

134
136
139
138
138
126c
124
122
132
133
130a
124
122
126b
130b
130a
132
133
124
122
126a
128
128
122
124
129
124

140
134
120
138
124
122
133
130a
132
130b
150
160a
160
160b
128

140
134
120
138
162
124
122
133
130a
132
130b
150
160a
128
160
160b 168
170
166

216
210
120
124
122
133
130a
132
130b
128

134
150
160
160a
160b 230
120
124
122
124
122
124
122
122
124
234
128
128
232

230
180
182
184
182
134
120
138
124
122
133
130a
124
132
130b
170
150
132
130a
160a
128
133
234
160
122
124
128
160b
232

254
250
170
182
184
180
182
134
138
120
124
122
133
124
130a
132
130b
258
256
150
128
124
122
160
128
260
262

264
126a
126b
126c
129
124
128
122
266
268
270
272
130b
138
134
120

130c
114
112

264
278
134
120
126c
138
124
122
268
274
114
266
130c
130b
276
112
128
160
129

SEMICONDUCTOR DEVICE AND METHOD OF FORMING AN ANTENNA-IN-PACKAGE STRUCTURE

FIELD OF THE INVENTION

The present invention relates in general to semiconductor devices and, more particularly, to a semiconductor device and method of forming an antenna-in-package (AiP) structure.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices may contain multiple electrical components, e.g., multiple semiconductor die and myriad discrete components to support the semiconductor die, disposed on one or more substrates to perform necessary electrical functions. Such a package is commonly referred to as a system-in-package (SiP) module. SiP modules and other semiconductor packages that include one or more antennae for transmitting and receiving electromagnetic signals are commonly called antenna-in-package (AiP) modules.

In recent years, 5G technology has been implemented by a high frequency AiP with system chips and an antenna integrated into one package. The AiP concept has been adopted for mobile handsets and other portable multimedia devices to reduce overall device size. However, AiP modules now require reduced interface pitches, higher interface pin counts, reduced thickness, and higher integration to continue to improve performance and further reduce size. Therefore, a need exists for improved AiP structures.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
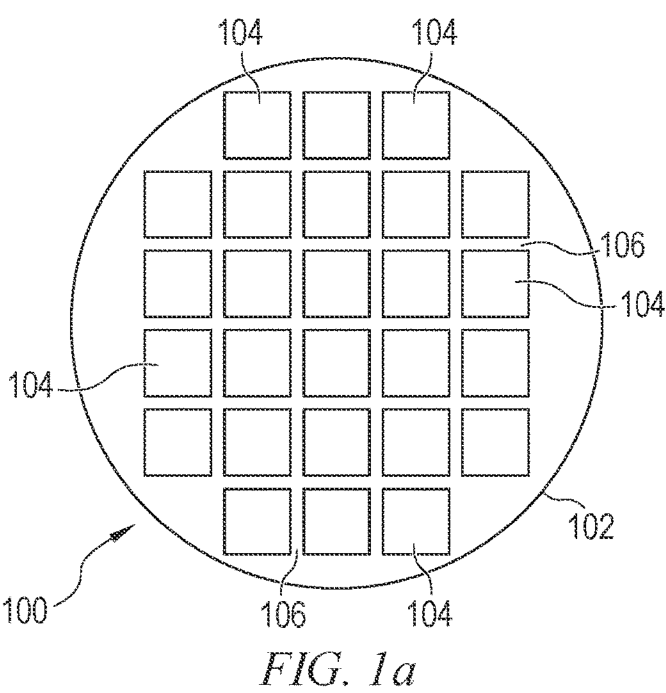
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
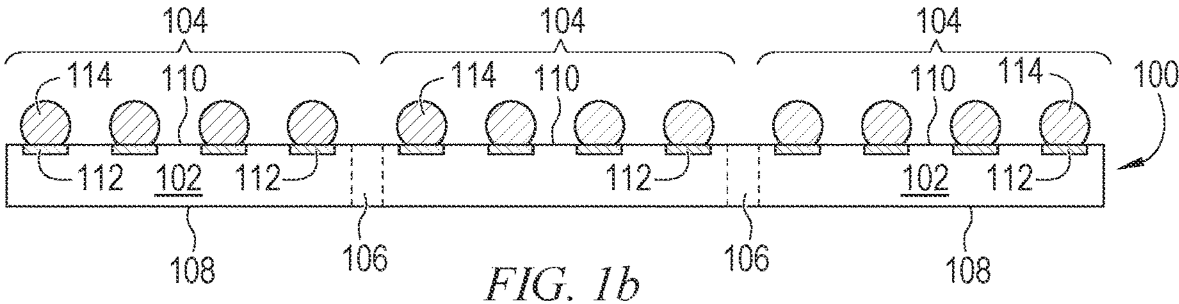

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bumps, micro bumps, or another type of electrical interconnect.

Figure 1C:
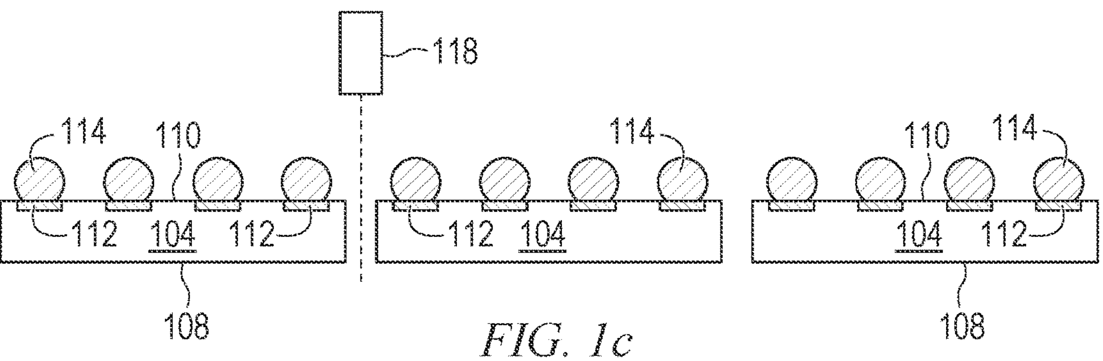

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figures 2A, 2B:
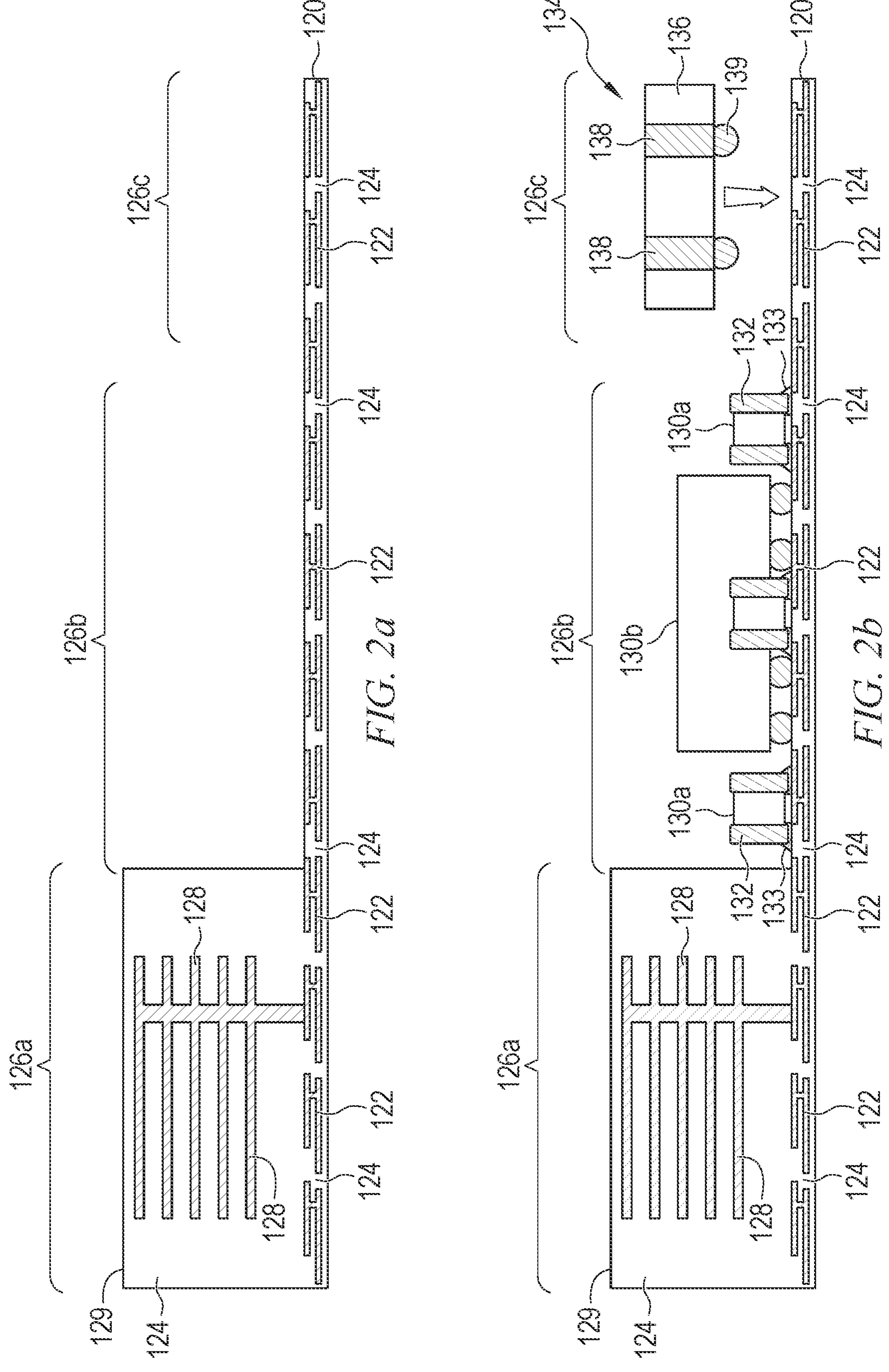
FIGS. 2*a*-2*j* illustrate forming an AiP module.
Figures 2C, 2D:
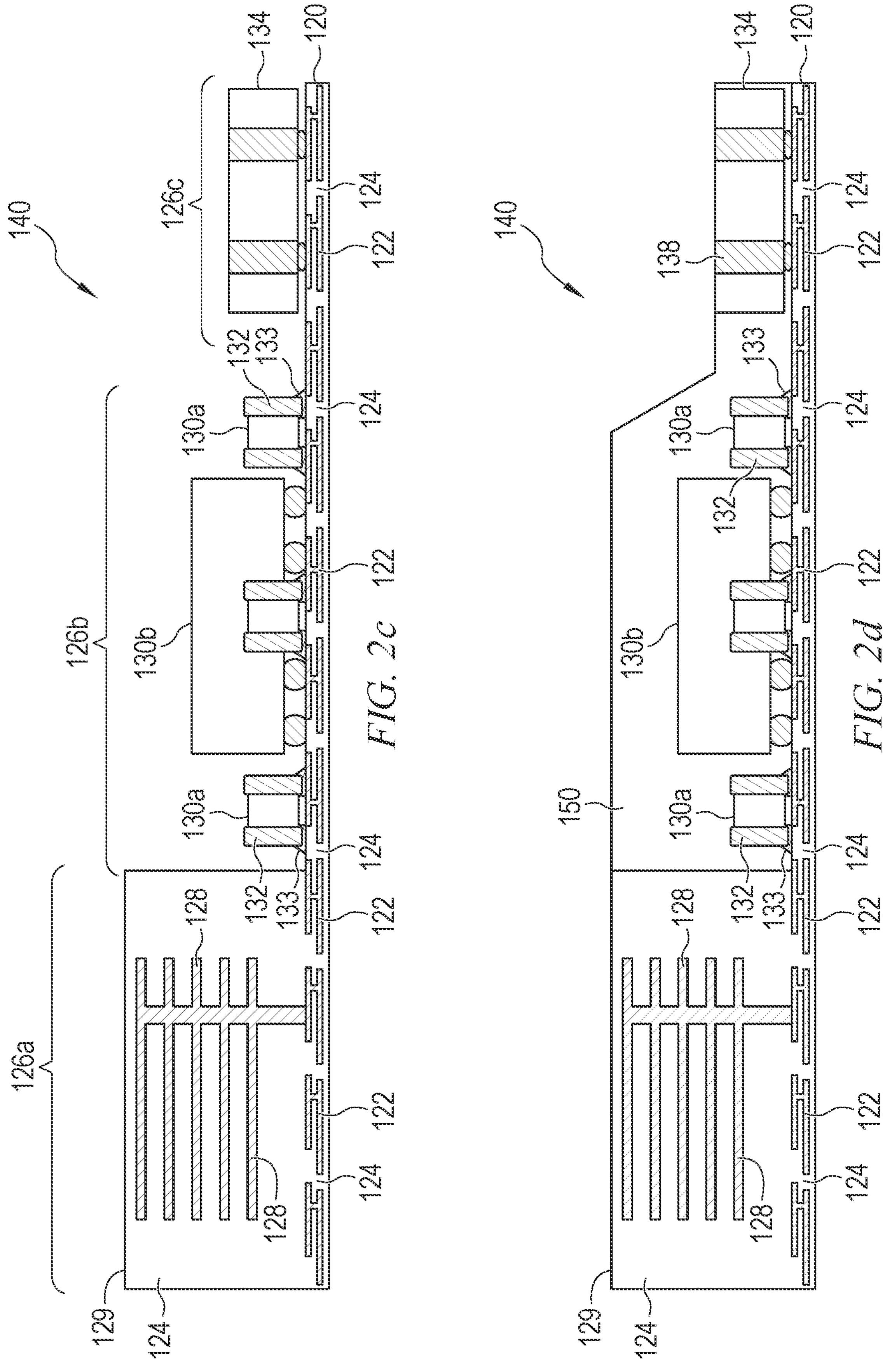
Figure 2E:
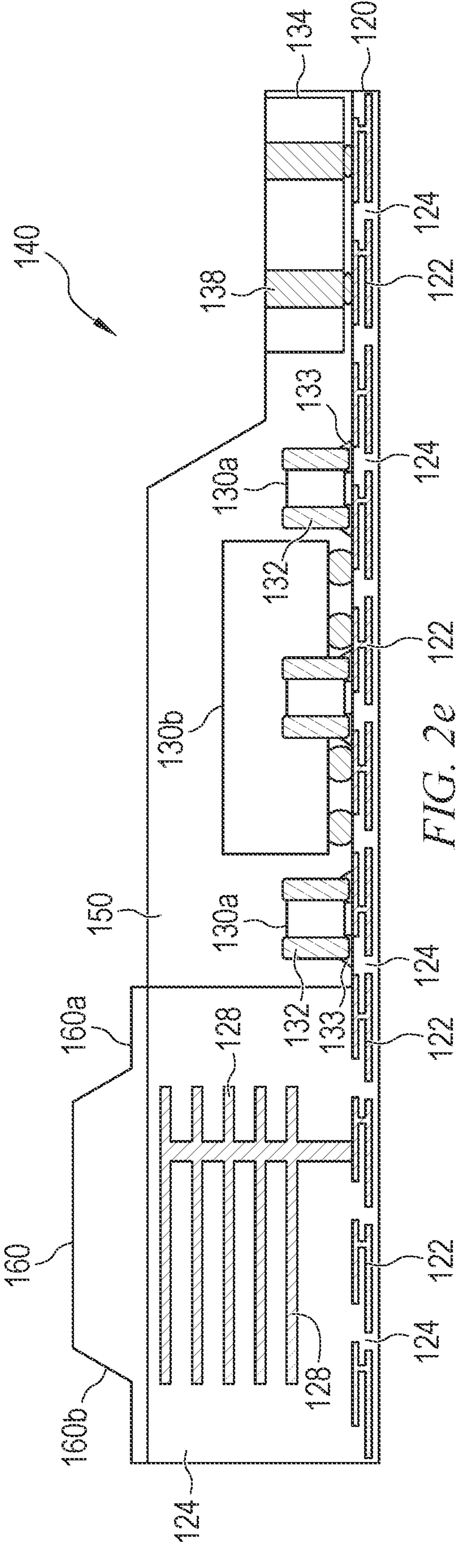

FIGS. 2*a*-2*j* illustrate a process of forming an improved antenna-in-package (AiP) module. FIG. 2*a* shows a cross-sectional view of multi-layered interconnect substrate 120 including conductive layers 122 and insulating layers 124. While only a single substrate 120 suitable to form a single semiconductor package is shown, hundreds or thousands of units are commonly manufactured and processed as part of a single substrate before being singulated from each other, using the same steps described herein performed en masse. A separate substrate 120 could also be used for each unit being manufactured, the substrate being singulated before the steps shown in FIGS. 2*a*-2*j* and a plurality of individual substrates being placed on a common carrier for processing.

Conductive layers 122 can be one or more layers of Al, Cu, Sn, Ni, Au, Ag, or other suitable electrically conductive material. Conductive layers 122 can be formed using PVD, CVD, electrolytic plating, electroless plating, or another suitable metal deposition process. Conductive layers 122 provide horizontal electrical interconnect across substrate 120 and vertical electrical interconnect between layers of the substrate. Portions of conductive layers 122 can be electrically common or electrically isolated depending on the design and function of the package being formed.

Insulating layers 124 contain one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers 124 can be formed using PVD, CVD, printing, lamination, spin coating, spray coating, sintering, thermal oxidation, or another suitable process. Insulating layers 124 provide isolation between conductive layers 122. Any number of conductive layers 122 and insulating layers 124 can be interleaved over each other to form substrate 120. Any other suitable type of package substrate or leadframe is used for substrate 120 in other embodiments.

An antenna block 126*a* is formed as part of substrate 120 by successively forming conductive layers 122 and insulating layers 124 to form antennae 128. Antennae 128 are conductive structures built up as part of the process of forming substrate 120. After substrate 120 is completely formed within component area 126*b* and interconnect area 126*c*, additional conductive layers 122 and insulating layers 124 are formed within the area for antenna block 126*a* to increase the thickness in that area while the component area and interconnect area remain at a lower thickness. A top surface 129 of antenna block 126*a* is at a higher level relative to the top surface of substrate 120 within component area 126*b* and interconnect area 126*c*.

Any suitable type of antenna can be formed, the illustrated structures are only for purpose of explanation and do not in any way limit the types of antennae that can be used. In some embodiments, antenna block 126 is formed with antennae 128 exposed from a top or side surface of the antenna block. In other embodiments, antenna block 126*a* is formed as a separate block from substrate 120 and then mounted onto the substrate after formation. Antenna block 126*a* is a chip antenna in one embodiment.

In FIG. 2*b*, electrical components 130*a* and 130*b*, and any other desired electrical components, are disposed on substrate 120 in component area 126*b* and electrically and mechanically connected to conductive layers 122. Electrical components 130 are positioned over substrate 120 using a pick and place operation. For example, electrical components 130*a* can be discrete electrical devices, such as diodes, transistors, resistors, capacitors, and inductors. Electrical components 130*b* can be, or be made similar to, semiconductor die 104 from FIG. 1*c* with bumps 114 oriented toward substrate 120. Alternatively, electrical components 130 can include any other desired semiconductor die, semiconductor packages, surface mount devices, RF components, or discrete electrical devices. Any of the electrical components 130 can also have integrated passive devices (IPDs) formed thereon.

Electrical components 130 are brought into contact with a conductive layer 122 of substrate 120. Terminals 132 of electrical components 130*a* are electrically and mechanically connected to conductive layer 122 using solder or conductive paste 133. Electrical components **130*b* are electrically and mechanically connected to conductive layer 122 by reflowing bumps 114** onto contact pads of the conductive layer.

One or more PCB units, e-bars, or modular interconnect units 134 are disposed over substrate 120 within interconnect area **126*c* in a similar manner to electrical components 130. Modular interconnect unit 134 is disposed onto substrate 120 using a pick-and-place machine. Modular interconnect unit 134 includes an insulating core 136 and a plurality of conductive vias 138 extending through the insulating core. Solder bumps 139 are disposed between substrate 120 and conductive vias 138 and are reflowed to electrically and mechanically connect modular interconnect unit 134 to substrate 120. Modular interconnect unit 134 optionally includes contact pads, solder resist layers, or both formed over the top, bottom, or both surfaces of the modular interconnect unit. Modular interconnect unit 134 provides vertical interconnect from substrate 120**, which will be explained in further detail below.

FIG. **2*c* illustrates electrical components 130 electrically and mechanically connected to conductive layers 122 of substrate 120. Any desired combination of electrical components of any suitable type can be used to form a semiconductor package on substrate 120. Electrical components can also be disposed over the bottom surface or within the layers of substrate 120**.

In FIG. **2*d*, encapsulant or molding compound 150 is deposited over and around substrate 120, electrical components 130 and modular interconnect unit 120 using a paste printing, compressive molding, transfer molding, liquid encapsulant molding, vacuum lamination, spin coating, or another suitable applicator. Encapsulant 150 can be liquid or granular polymer composite material, such as epoxy resin, epoxy acrylate, or polymer, with or without an added filler. Encapsulant 150 is non-conductive, provides structural support, and environmentally protects the semiconductor device from external elements and contaminants. Encapsulant 150 completely covers tops and all sides of electrical components 130, while modular interconnect structure 134** remains exposed from the encapsulant for subsequent electrical interconnect.

Encapsulant 150 is molded with a stepped shape so that a top surface of the encapsulant in a region adjacent to antenna block **126*a* is coplanar to a top surface 129 of the antenna block and the top surface of the encapsulant in a region adjacent to modular interconnect unit 134 is coplanar to the modular interconnect unit. The areas of different heights of encapsulant 150 correspond to the encapsulant being thicker in component area 126*b* and thinner in interconnect area 126*c*, with a linear height gradient between the areas of differing thicknesses, but that does not need to be true in all embodiments. The stepped shape of encapsulant 150 is provided by utilizing a mold chase with the desired shape or by any other suitable means. In other embodiments, a height of modular interconnect unit 134 is approximately the same as a height of antenna block 126*a* so that all three of the encapsulant 150**, antenna block, and modular interconnect structure top surfaces are coplanar without a stepped encapsulant.

Figure 2F:
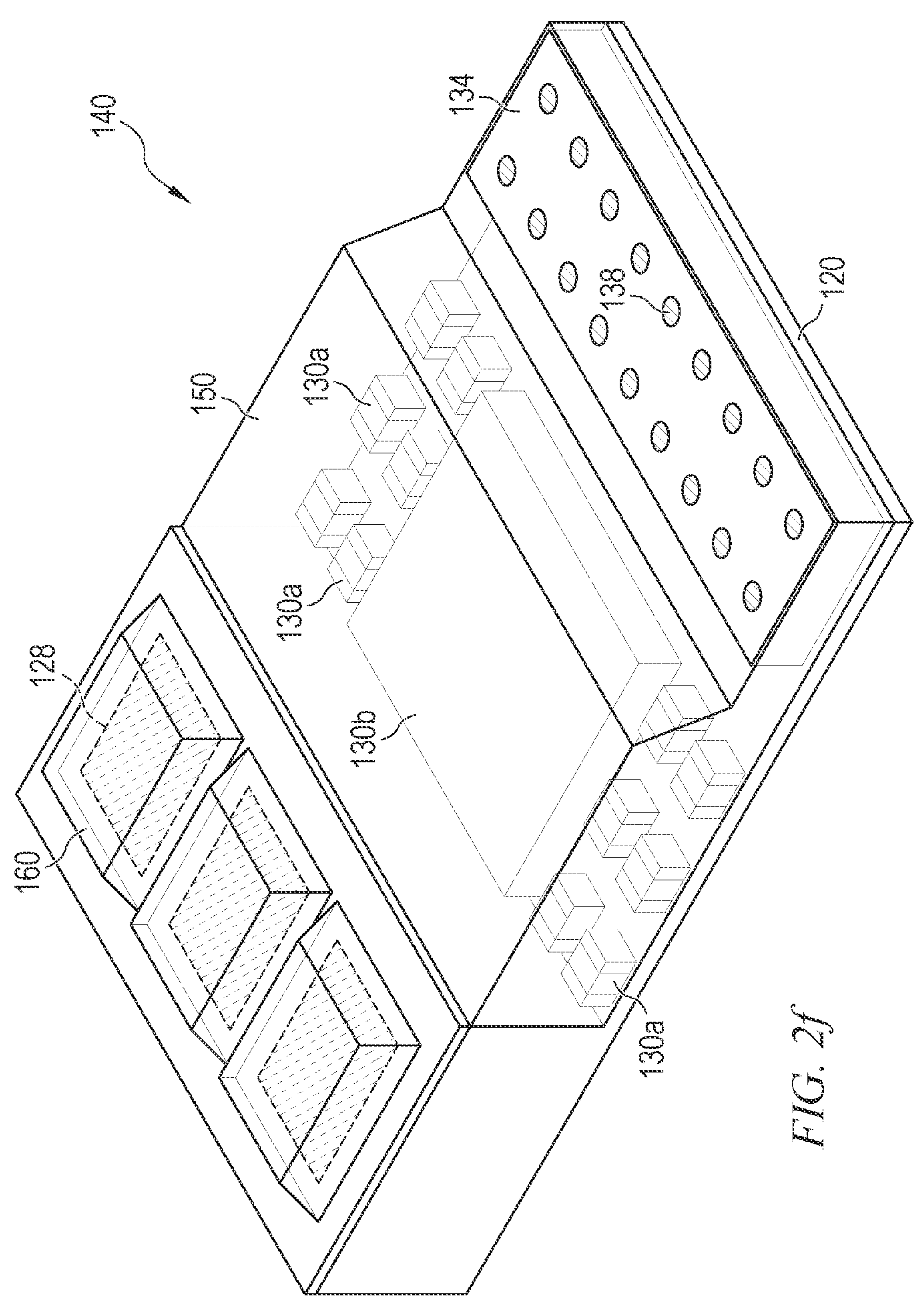
Figures 2G, 2H:
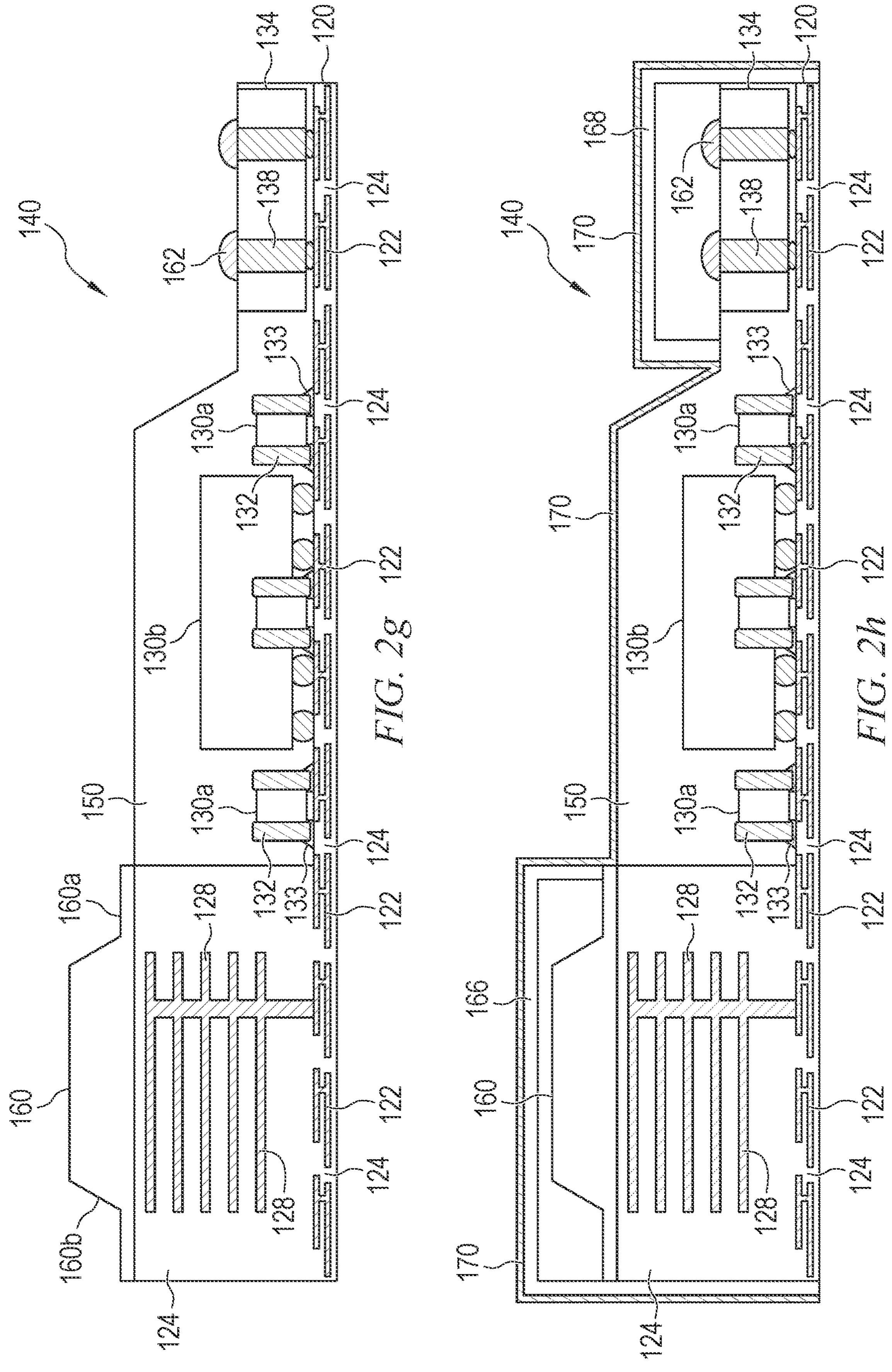

In FIG. **2*e*, a high dielectric constant (high-k) encapsulant 160 is deposited over antenna block 126*a*. FIG. 2*f* shows a perspective view of package 140 with both encapsulant 150 and high-k encapsulant 160. High-k encapsulant 160 is deposited in a similar process and is generally similar to encapsulant 150. A mold chase with the desired shape for high-k encapsulant 160 is used to form the high-k encapsulant only over antenna block 126*a***.

High-k encapsulant 160 is optionally formed with a flat portion **160*a* that extends horizontally to fully cover antenna block 126*a*. A trapezoidal portion 160*b* of high-k encapsulant 160 is formed over each individual antenna 128. The flat portion 160*a* aids in molding by allowing the mold to be formed as one continuous body across all antennae 128 for an entire column or row of packages 140 formed at once. Flat portion 160*a* may have a different shape that does not completely cover antenna block 126*a* or that extends past the antenna block onto encapsulant 150**.

The thicker trapezoidal portion **160*b* is formed over each antenna 128. The perspective of FIG. 2*f* shows three antennae 128 and three corresponding trapezoids of high-k encapsulant 160. In other embodiments, the number and shape of antennae 128 is different, with the thicker portions of high-k encapsulant 160 modified accordingly to ensure a thicker portion covering the footprint of all antennae 128. The sloped sidewalls of trapezoidal portions 160*b* may be rounded, angled differently, vertical, or another suitable shape. In other embodiments, the entire area of antenna block 126*a* is covered by high-k encapsulant 160 at the same thickness of trapezoid portion 160*b*. However, the thicker portion of high-k encapsulant 160 is most useful directly over and near where antennae 128 are actually formed. Thus, thicker trapezoid portions 160*b* are formed over antennae 128 while other areas have thinner flat portion 160*a*** to reduce material costs.

The primary difference between high-k encapsulant 160 and encapsulant 150 is the material used. High-k encapsulant 160 has a higher dielectric constant than encapsulant 150, which improves the performance of antennae 128 but is not necessary for use with electrical components 130. Using two different molding steps allows the more expensive high-k encapsulant 160 to be used just over antenna block **126*a* while cheaper conventional encapsulant 150 is used for the main body of package 140**.

In FIG. **2*g*, solder bumps 162 are formed over conductive vias 138 of modular interconnect unit 134. Solder bumps 162 are formed in a similar manner to bumps 114 being formed over semiconductor die 104, e.g., solder paste printing, ball drop, or another solder dispensing method followed by reflow to form balls or bumps. Another suitable interconnect structure is formed or disposed over modular interconnect unit 134 in other embodiments. Bumps 162** can be formed at an earlier or later manufacturing stage as convenient.

In FIG. **2*h*, shielding layer 170 is deposited, printed, sputtered, plated, or otherwise formed over semiconductor package 140. Plating can be performed by CVD, PVD, other sputtering methods, electroless plating, or other suitable metal deposition process. Shielding layer 170 includes one or more layers of Al, Cu, Sn, Ni, Au, Ag, or other suitable electrically conductive material. When multiple packages 140 are formed as a panel of devices over a single substrate 120, the panel is typically singulated prior to forming shielding layer 170 so that side surfaces of the packages are exposed to the metal deposition process. Shielding layer 170 totally covers top and side surfaces of encapsulant 150 within component area 126*b*. In most embodiments, shielding layer 170 extends down side surfaces of package 140 to substrate 120 to physically and electrically contact exposed portions of conductive layer 122**, thereby connecting the shielding layer to an electrical ground.

During plating of shielding layer 170, a mask 166 is disposed over antenna block **126*a* and a mask 168 is disposed over interconnect area 126***c* to block shielding layer 170 from being formed directly on the antenna block or modular interconnect unit 134, respectively. Shielding layer 170 is formed on masks 166 and 168 instead of the underlying portions of package 140. Shielding layer 170 being formed on antenna block 126*a* in the final package would degrade antenna performance. Shielding layer 170 being formed on modular interconnect unit 134 would short circuit the terminals used later for electrical connection.

Figures 2I, 2J:
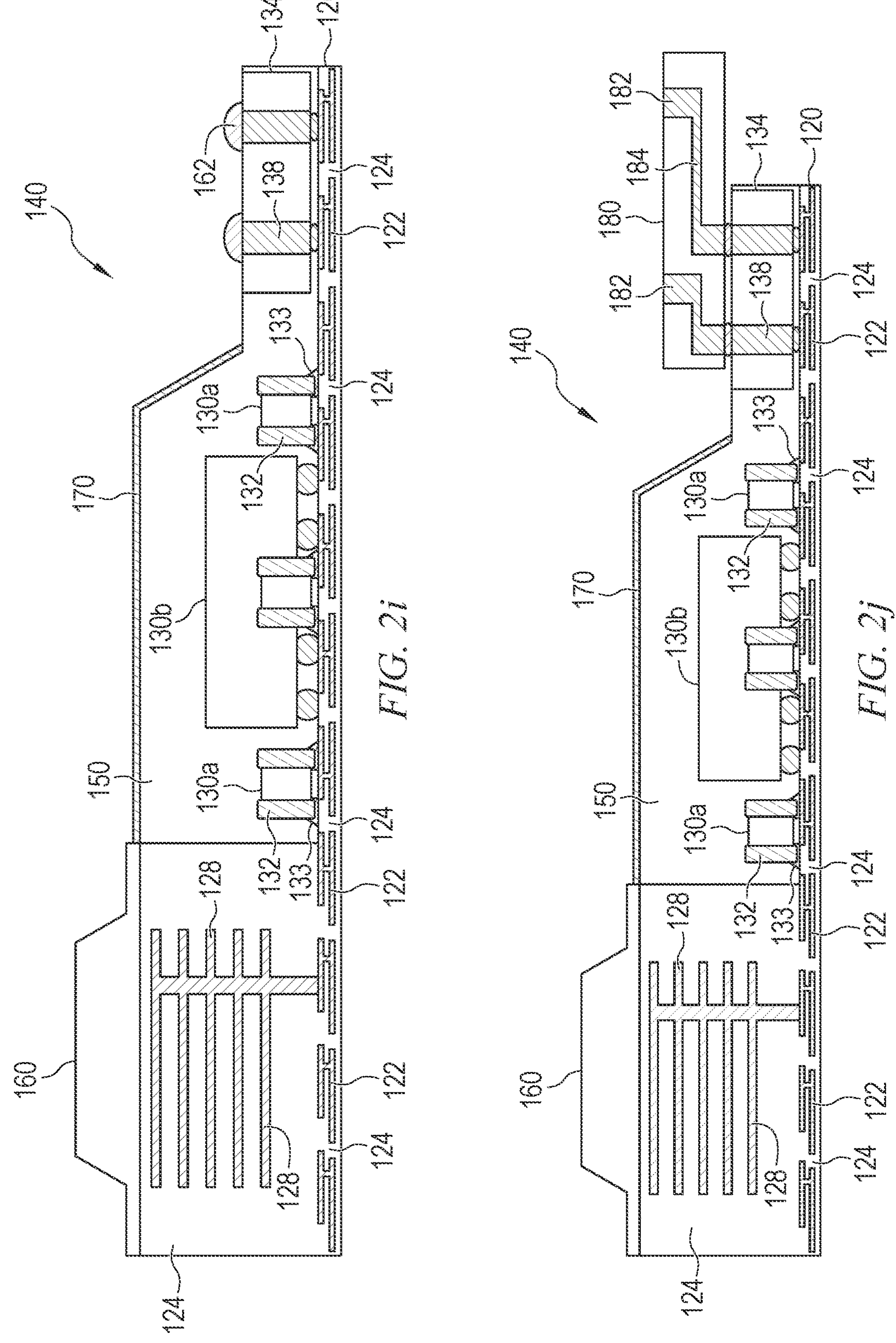

In FIG. 2*i*, masks 166 and 168 are removed to leave package 140 with shielding layer 170 formed only over component area 126*b* and not over antenna block 126*a* or interconnect area 126*c*. Masks 166 and 168 are removed using the same pick and place process or machine as used to dispose the masks over package 140. Masks 166 and 168 can be reused over additional semiconductor packages after being removed. Shielding layer 170 protects the underlying components 130 from potential malfunction due to electromagnetic interference (EMI).

In FIG. 2*j*, a connector 180 is mounted to modular interconnect unit 134. Connector 180 is physically and electrically connected to modular interconnect unit 134 by solder bumps 162. Connector 180 fans-out the electrical terminals of modular interconnect unit 134 using vias 182 and conductive traces 184. Connector 180 can simply be used for fan-out and leave contact pads, solder bumps, pins, or other interconnect structures exposed on the top surface of the connector. In other embodiments, connector 180 includes a board-to-board (B2B) connector, ribbon cable connector, or another type of inter-device connector. Having encapsulant 150 in interconnect area 126*c* recessed relative to the encapsulant in component area 126*b* keeps connector 180 below the top surface of the package, which helps to physically protect the connector.

FIG. 2*j* shows a completed package 140. The bottom surface of substrate 120 remains flat and completely covered in insulating layer 124. External electrical interconnect is solely via connector 180. Electrical components 130 are connected to connector 180 through modular interconnect unit 134 and substrate 120. In other embodiments, contact pads of conductive layer 122 are exposed on the bottom surface of substrate 120 as a land-grid array. In another embodiment, bumps or other interconnect structure are mounted onto the contact pads for interconnect to an underlying substrate. Semiconductor package 140 is an AiP module with a high-k encapsulant 160 disposed over antennae 128. High-k encapsulant 160 improves performance of antennae 128. Cost is reduced by having a conventional encapsulant 150 used in combination with the high-k encapsulant 160.

Figure 3A:
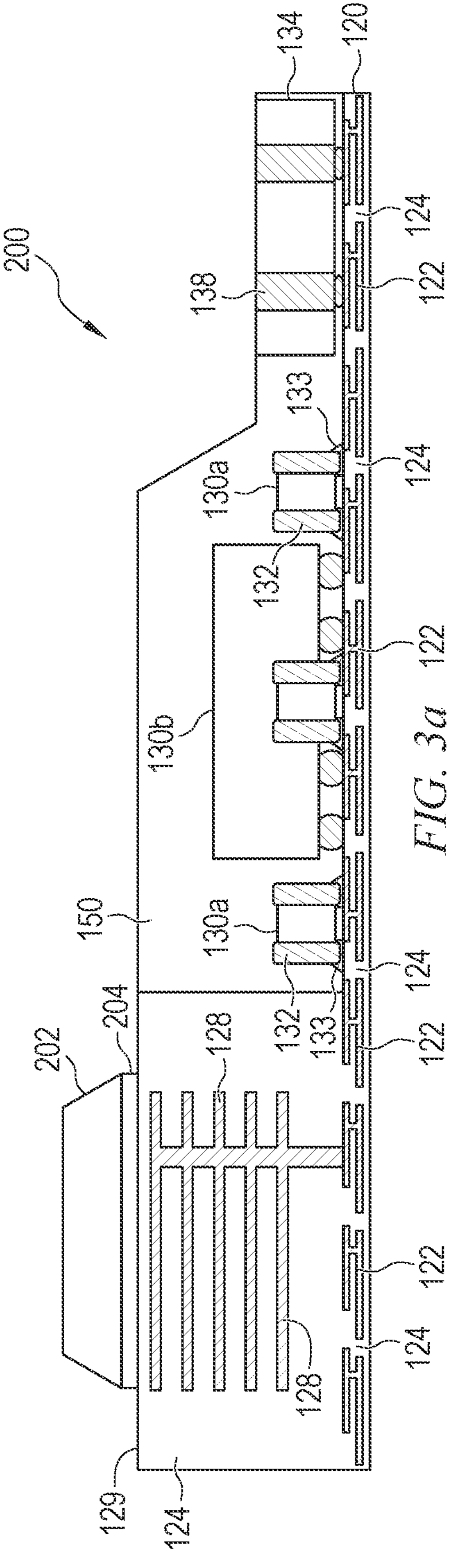
FIGS. 3*a* and 3*b* illustrate an alternative molding embodiment.
Figure 3B:
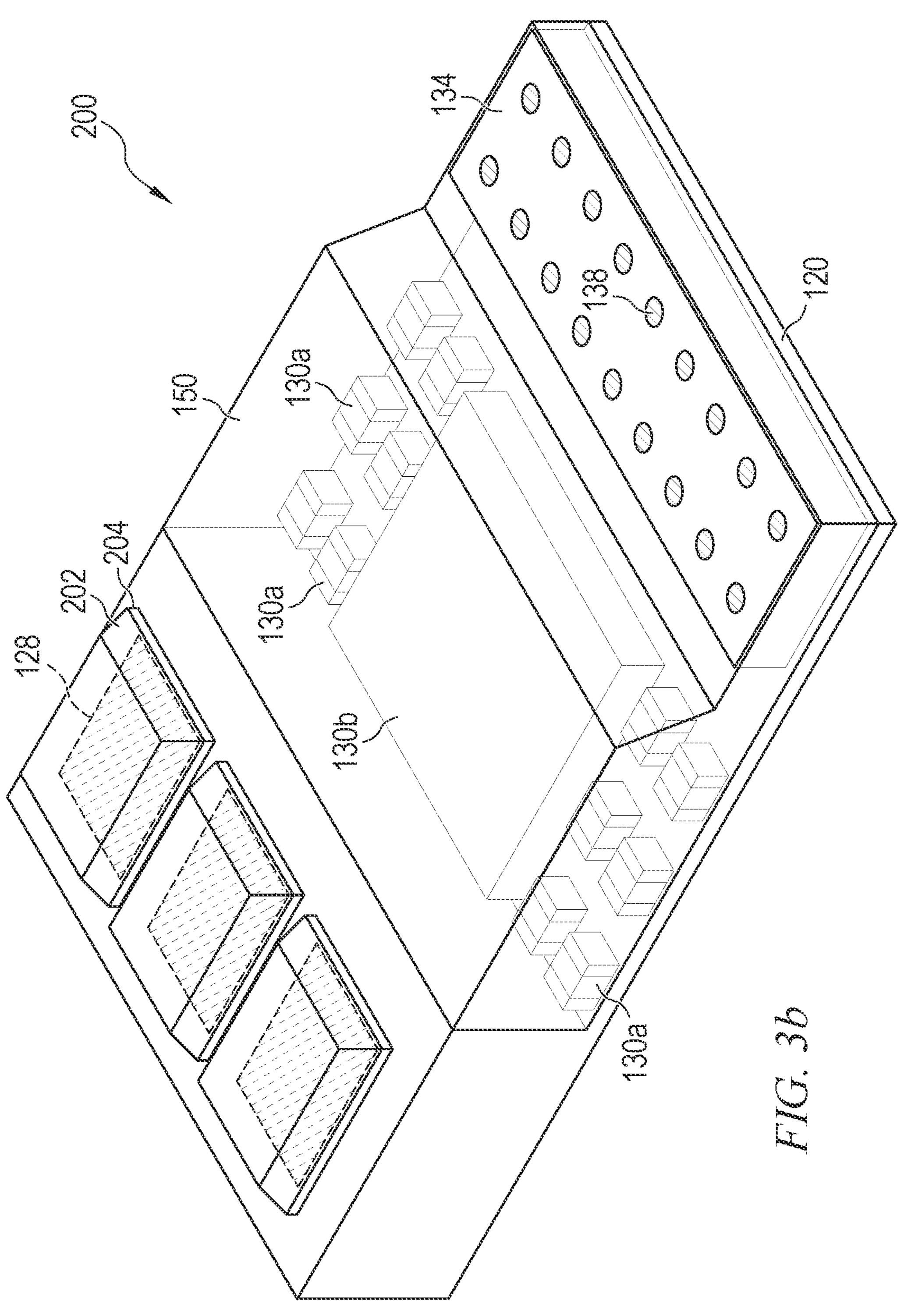

High-k encapsulant 160 in FIG. 2*j* was molded onto the top of antenna block 126*a*. FIGS. 3*a* and 3*b* show an embodiment where semiconductor package 200 is made with a pre-molded high-k block 202 instead of high-k encapsulant 160. FIG. 3*a* is a cross-sectional view while FIG. 3*b* is a perspective view. High-k block 202 is a similar or the same high dielectric constant material as high-k encapsulant 160. Instead of molding directly onto antenna block 126*a*, high-k block 202 is separately molded and then mounted to antenna block 126*a* using adhesive 204. High-k block 202 has the same trapezoidal shape as trapezoid portion 160*b*, but any other suitable shape is possible. In one embodiment, high-k block 202 is cut from a large sheet of material having the desired thickness. A separate high-k block 202 is mounted over each antenna 128 of antenna block 126*a*. In another embodiment, one larger block is used for multiple antennae 128 per semiconductor package 200. High-k blocks 202 reduce costs due to a reduction in the amount of molding material required when the molded areas over each antenna 128 no longer need to be connected by additional high-k encapsulant.

Figures 4A, 4B:
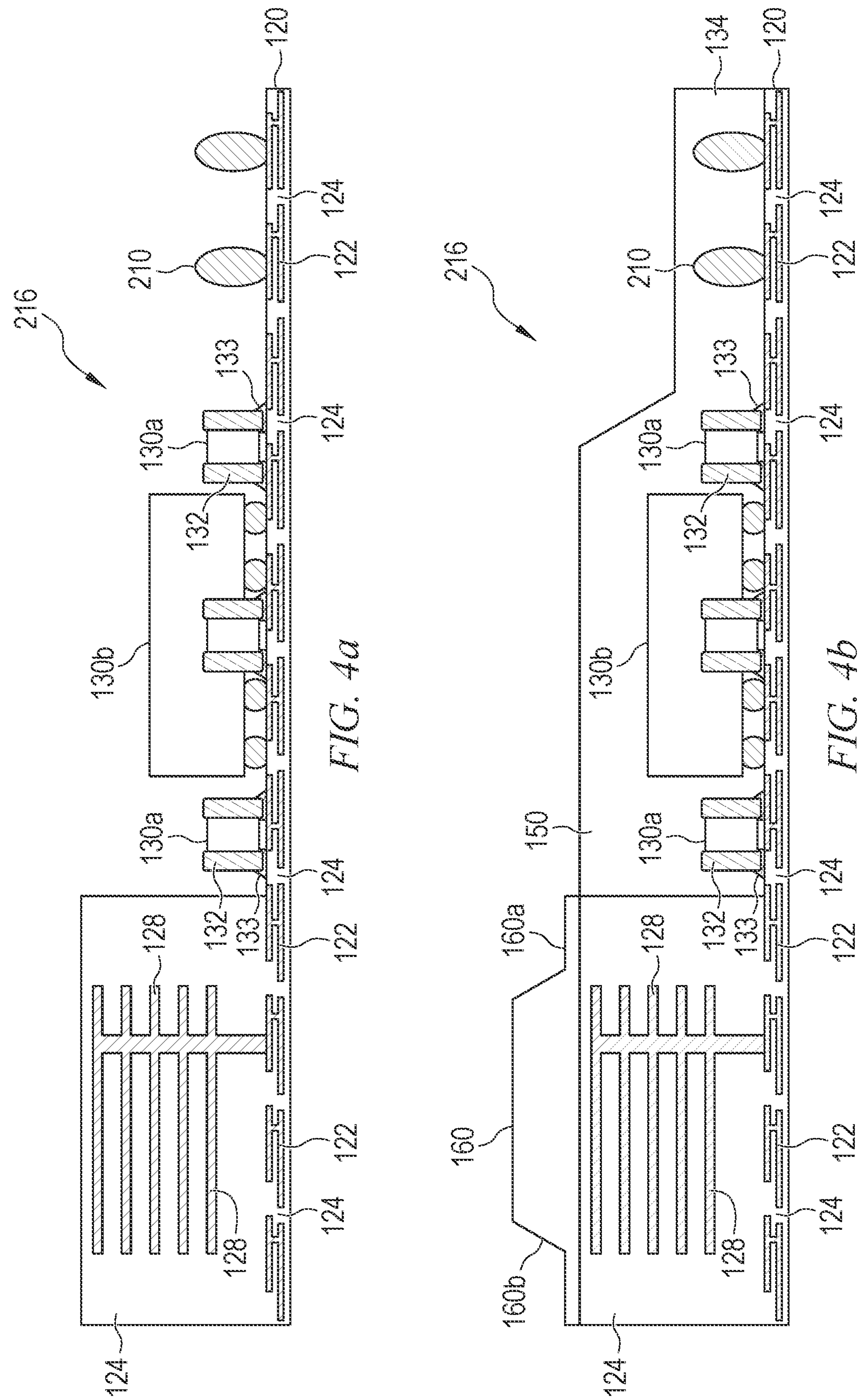
FIGS. 4*a*-4*c* illustrate conductive bumps used for external interconnect.
Figure 4C:
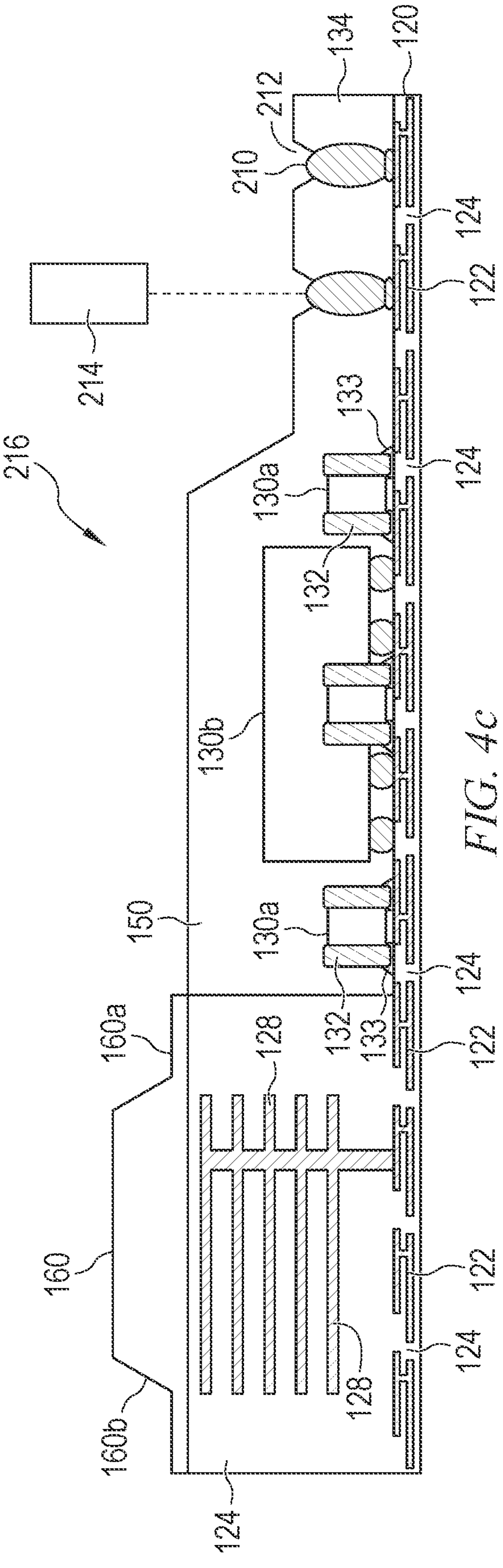

FIGS. 4*a*-4*c* show solder bumps 210 used as an alternative to modular interconnect unit 134. FIG. 4*a* shows solder bumps 210 disposed on contact pads of conductive layer 122. Bumps 210 are formed in a manner and of materials similar to those disclosed above for bumps 114 on semiconductor die 104. In FIG. 4*b*, encapsulant 150 is deposited over bumps 210 in a similar manner to the depositing of encapsulant 150 in FIG. 2*d*. Bumps 210 are completely covered by encapsulant 150. In other embodiments, bumps 210 are exposed from encapsulant 150 by using film-assisted molding or by mechanical planarization of interconnect area 126*c* after depositing encapsulant 150.

In FIG. 4*c*, bumps 210 are exposed for external interconnect by forming openings 212 through encapsulant 150 with a laser 214 to continue manufacturing semiconductor package 216. Alternatively, openings 212 can be formed with mechanical drilling or chemical etching. Openings 212 expose solder bumps 120. Additional solder or solder paste can be disposed into openings 212 so that the combined amount of solder extends over the top surface of encapsulant 150 within interconnect area 126*c* similar to conductive bumps 162. Connector 180 can then be attached by reflowing bumps 210 with the connector physically touching the bumps. In another embodiment, solder bumps are disposed on the bottom of connector 180 to bridge the potential gap between the connector and solder bumps 210. Other than the steps shown in FIGS. 4*a*-4*c*, manufacturing of package 216 proceeds the same as disclosed above for semiconductor package 140 in FIGS. 2*a*-2*j*.

Figures 5A, 5B:
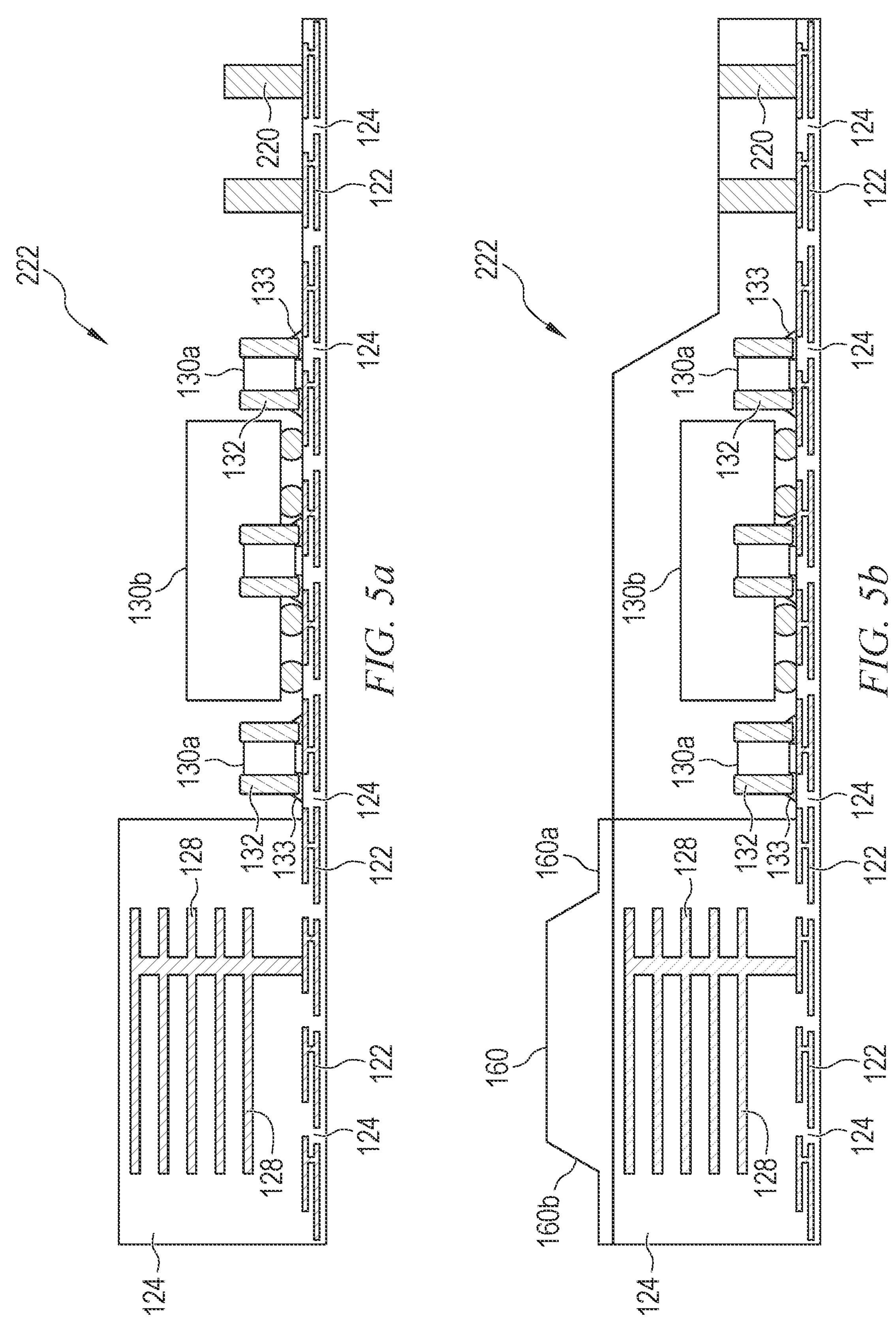
FIGS. 5*a* and 5*b* illustrate conductive pillars used for external interconnect.

FIGS. 5*a* and 5*b* illustrate another embodiment with conductive pillars 220 used for external interconnect instead of modular interconnect unit 134 or bumps 210. Conductive pillars 220 are disposed on contact pads of substrate 120 in FIG. 5*a*. Pillars 220 can be metal deposited into a mask opening over substrate 120 prior to the mask being removed. Any suitable metal deposition process can be used, such as those used to form conductive layers 122. In another embodiment, pillars 220 are separately formed and then disposed onto substrate 120. Pillars 220 are formed from copper, gold, aluminum, iron, tungsten, combinations thereof, or another suitable electrically conductive material.

Encapsulant 150 is deposited over pillars 220 in FIG. 5*b* to continue manufacturing semiconductor package 222. Pillars 220 are exposed from encapsulant 220 by using film-assisted molding or another molding process that prevents the encapsulant from covering the pillars. In another embodiment, interconnect area 126*c* is planarized after deposition of encapsulant 150 to expose pillars 220. Bumps 162 are disposed on pillars 220 to attach connector 180 as discussed above. An under-bump metallization or contact pad is optionally formed over pillars 220 after depositing encapsulant 150. Other than the steps shown in FIGS. 5*a* and 5*b*, manufacturing of package 222 proceeds the same as disclosed above for semiconductor package 140 in FIGS. 2*a*-2*j*.

Figures 6A, 6B:
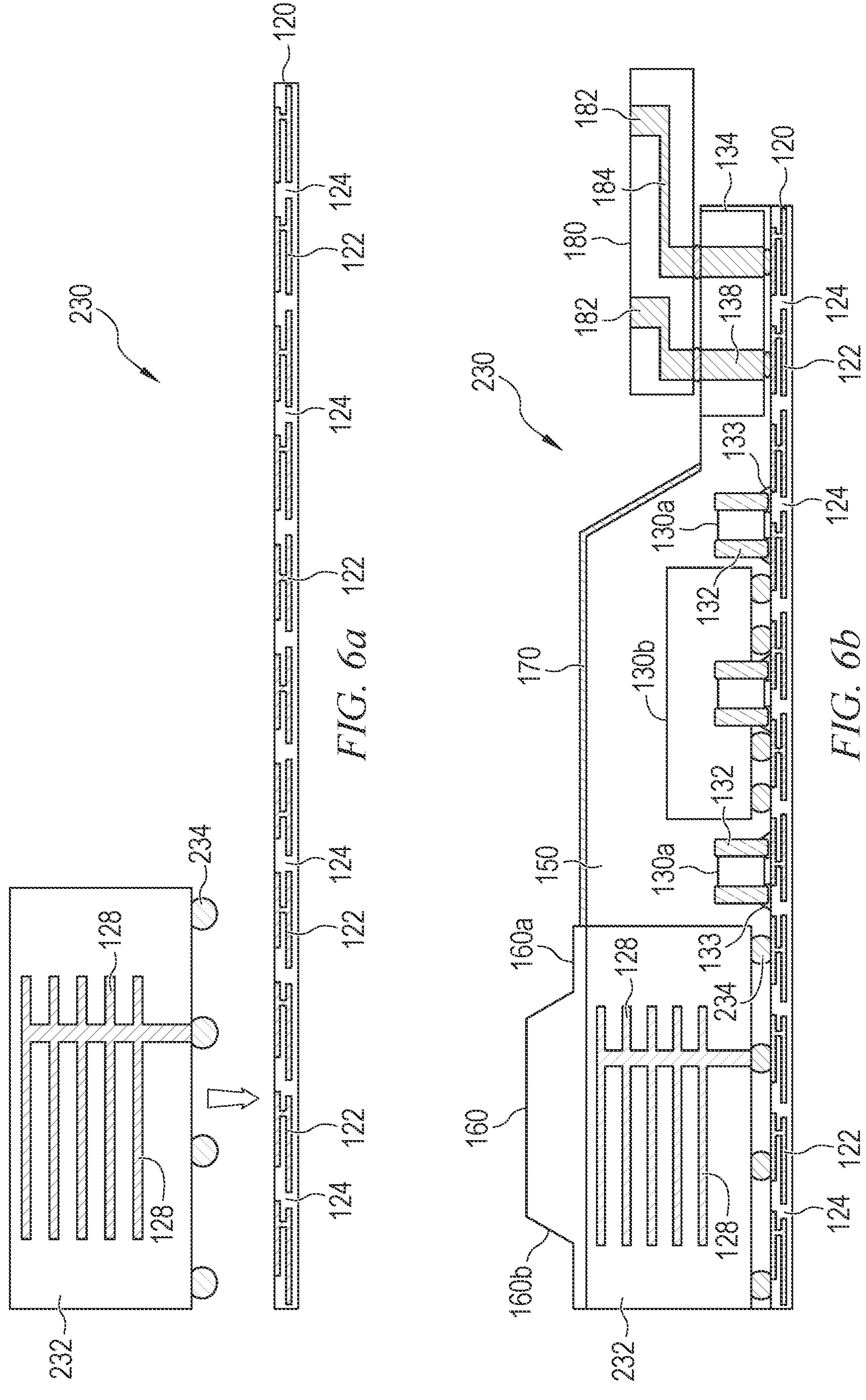
FIGS. 6*a* and 6*b* illustrate an embodiment with a separately formed antenna block.

FIGS. 6*a* and 6*b* illustrate a semiconductor package 230 being formed with an antenna block 232 formed separately from substrate 120. Antenna block 232 has all the qualities and is formed similar to antenna block 126*a* above, except being formed as a block separately from substrate 120. Antenna block 232 has contact pads or another suitable interconnect structure on the bottom of the antenna block to allow bumps 234 to electrically and mechanically connect the antenna block to substrate 120. Antenna block 232 is disposed over and mounted to substrate 120 in FIG. 6*a*. Bumps 234 are reflowed between antenna block 232 and conductive layer 122 of substrate 120 to attach the antenna block.

Besides antenna block 232 being formed separately from substrate 120 and attached by solder bumps 234 or another suitable interconnect structure, package 230 is formed in substantially the same process as disclosed above. FIG. 6*b* shows the completed package with two separate encapsulants 150 and 160. Connector 180 is mounted over modular interconnect unit 134. Solder bumps 210 or conductive pillars 220 can be used with package 230 instead of modular interconnect unit 134. High-k block 202 can be used instead of high-k encapsulant 160.

Figure 7:
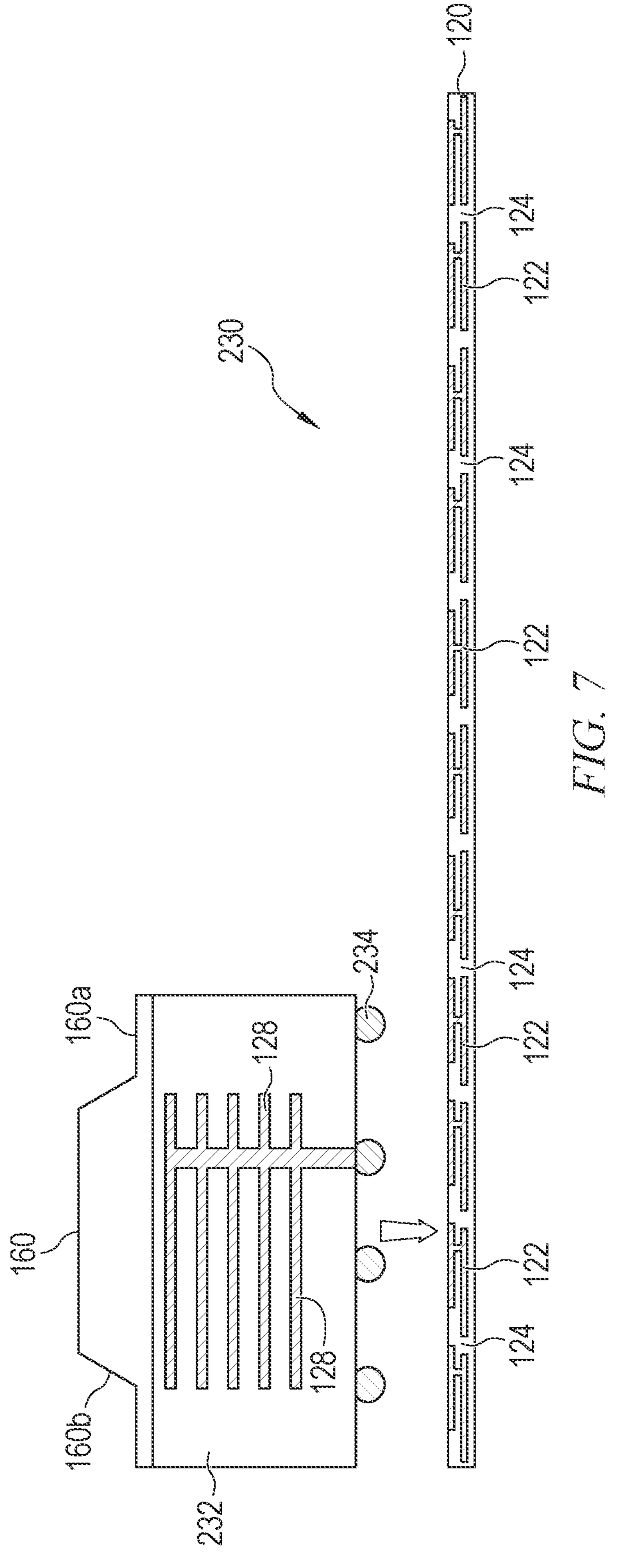
FIG. 7 shows pre-molded high dielectric constant encapsulant on the separately formed antenna block.

Alternatively, high-k encapsulant 160 or high-k block 202 can be applied onto antenna block 232 prior to the antenna block being installed onto substrate 120, as shown in FIG. 7. Pre-applied encapsulant 160 can be used with any of the above-disclosed embodiments.

Figure 8:
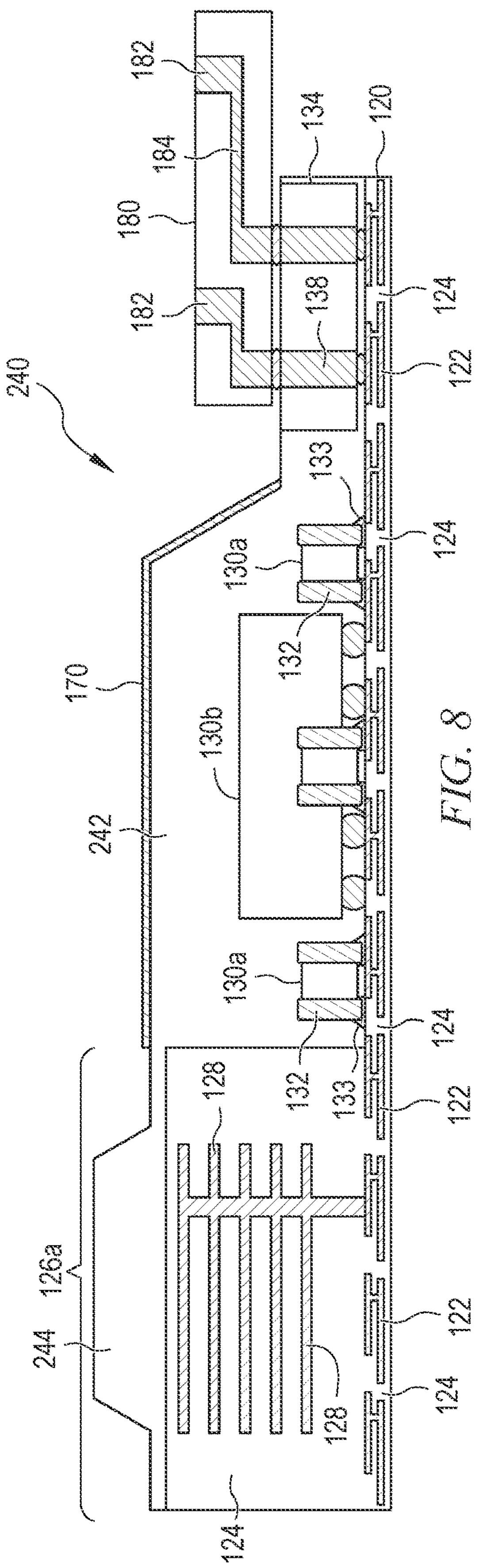
FIG. 8 illustrates a unitary molding embodiment.

FIG. 8 shows an embodiment as semiconductor package 240 with a unitary encapsulant 242. Unitary encapsulant 242 is a single encapsulant that is deposited together and extends completely from over antenna block 126*a* to modular interconnect unit 134. Only a single encapsulant deposition process step is used instead of two separate steps as in the previous embodiments. Encapsulant 242 both encapsulates electrical component 130*b* and also forms a high-k encapsulant block 244 over antenna block 126*b* to improve antenna performance as described above. Unitary encapsulant 242 can be used with any of the above or below embodiments instead of two or more separate encapsulants. High-k encapsulant can be used for the entirety of package 240 to maintain the benefits to antenna block 126*a*.

Figures 9A, 9B:
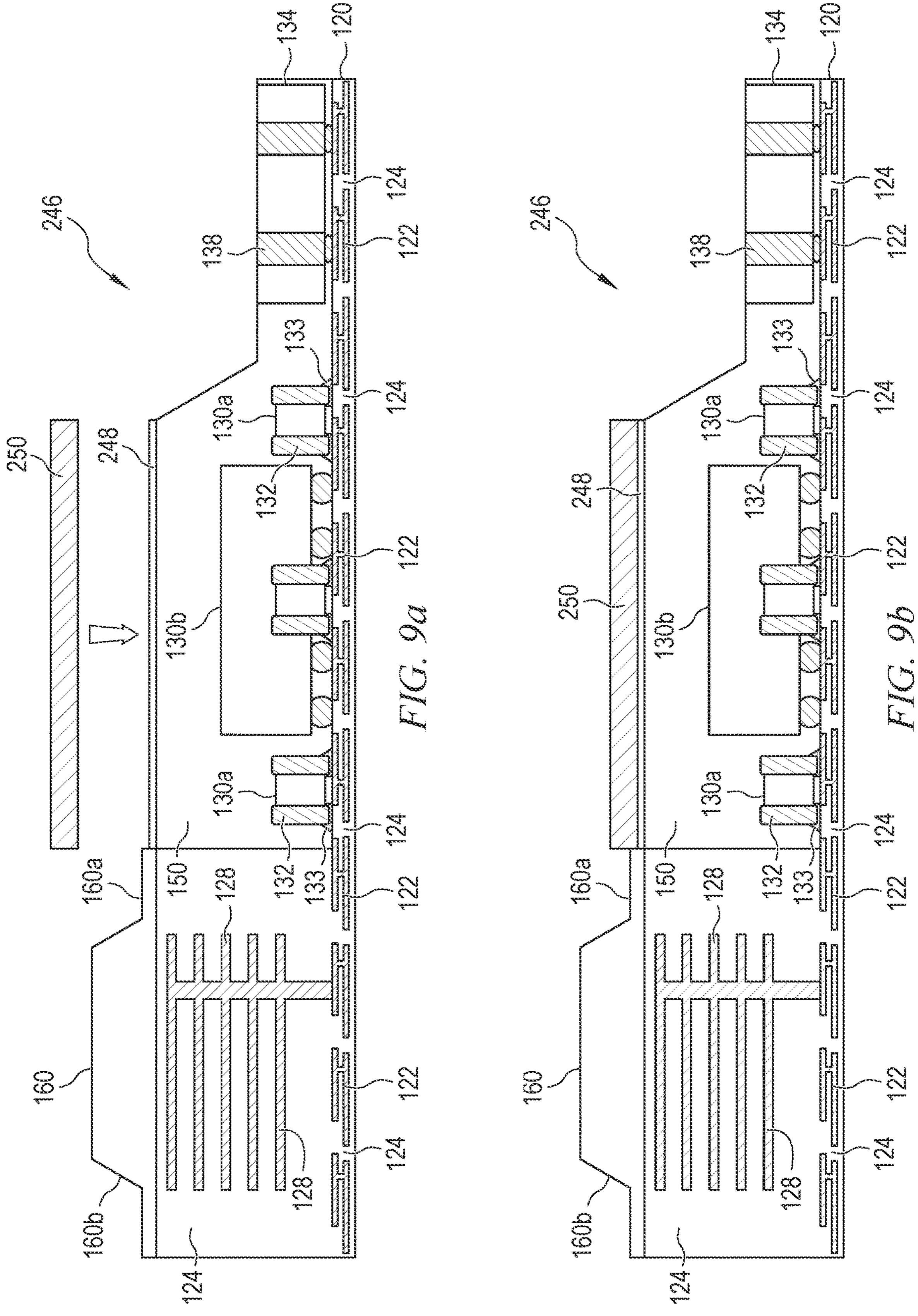
FIGS. 9*a* and 9*b* illustrate a lidded embodiment.
Figure 10:
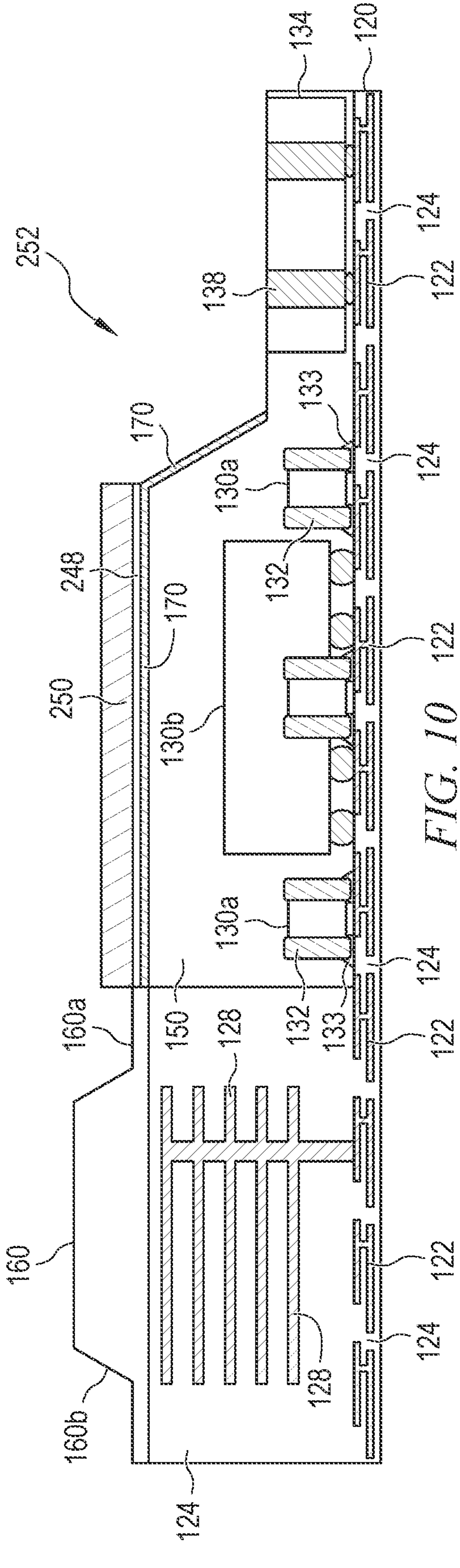
FIG. 10 illustrates the lid mounted onto a shielding layer.

FIGS. 9*a* and 9*b* show a package 246 formed with a lid 250. Lid 250 is a pre-formed lid attached to encapsulant 150 over electrical components 130 with an adhesive or thermal interface material 248. Lid 250 is formed of copper, gold, steel, or other suitable materials. Lid 250 is cut to size from a sheet of material. Adhesive 248 is first disposed on encapsulant 150 as shown in FIG. 9*a* or alternatively can be placed first on lid 250. Then, lid 250 is disposed on encapsulant 150 as shown in FIG. 9*b*. Adhesive 248 is disposed between lid 250 and encapsulant 150 to keep the lid attached to package 246. Lid 250 can be used in any of the above or below embodiments. For example, FIG. 10 shows an embodiment where package 252 has lid 250 attached to shielding layer 170 instead of directly to encapsulant 150.

Figures 11A, 11B:
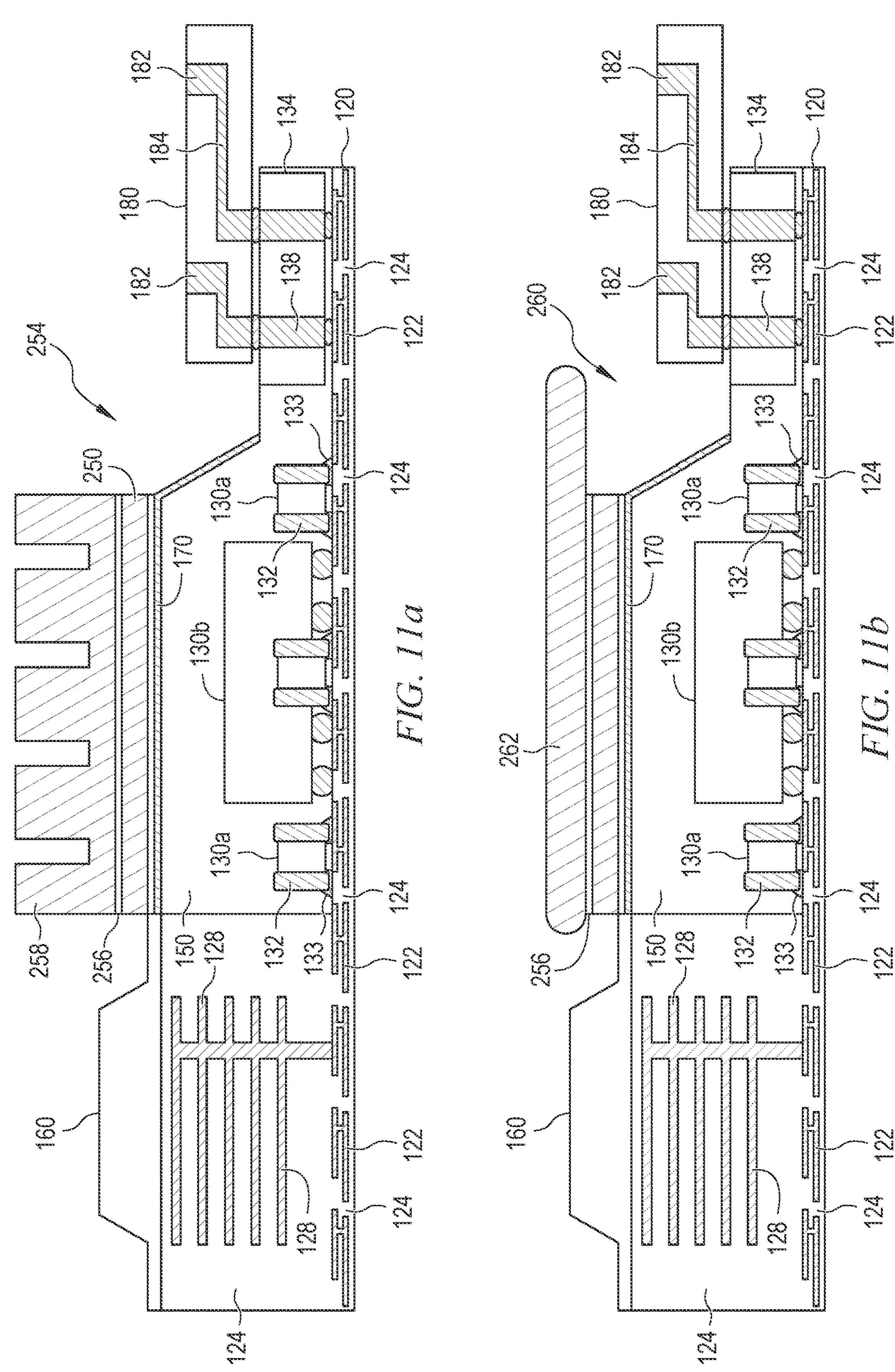
FIGS. 11*a* and 11*b* illustrate additional thermal management options.

Lid 250 provides some measure of EMI protection similar to shielding layer 170, and also improves thermal management by absorbing thermal energy generated by electrical components 130. FIGS. 11*a* and 11*b* illustrate mounting additional thermal management elements in addition to lid 250. In FIG. 11*a*, package 254 has a heatsink 258 attached to lid 250 with adhesive or thermal interface material 256. Heatsink 258 includes a plurality of fins or other structures to promote thermal transfer from lid 250 to ambient air. Heatsink 258 can be machined from a block of copper, steel, or another suitable material.

FIG. 11*b* shows package 260 with a heat pipe 262 attached to lid 250. Heat pipe 262 absorbs thermal energy from lid 250 and transfers the thermal energy to another location where there may be a heatsink or fan to dissipate the thermal energy to ambient air. Heat pipe 262 includes a volatile liquid that turns into a vapor by absorbing heat from lid 250. The vapor then travels along the heat pipe to the fan or heatsink and condenses back into a liquid, releasing the latent heat. The liquid then returns to the end of heat pipe 262 with lid 250 attached. Any embodiments described above or below can use lid 250 with or without heatsink 258 or heat pipe 262.

Figures 12A, 12B:
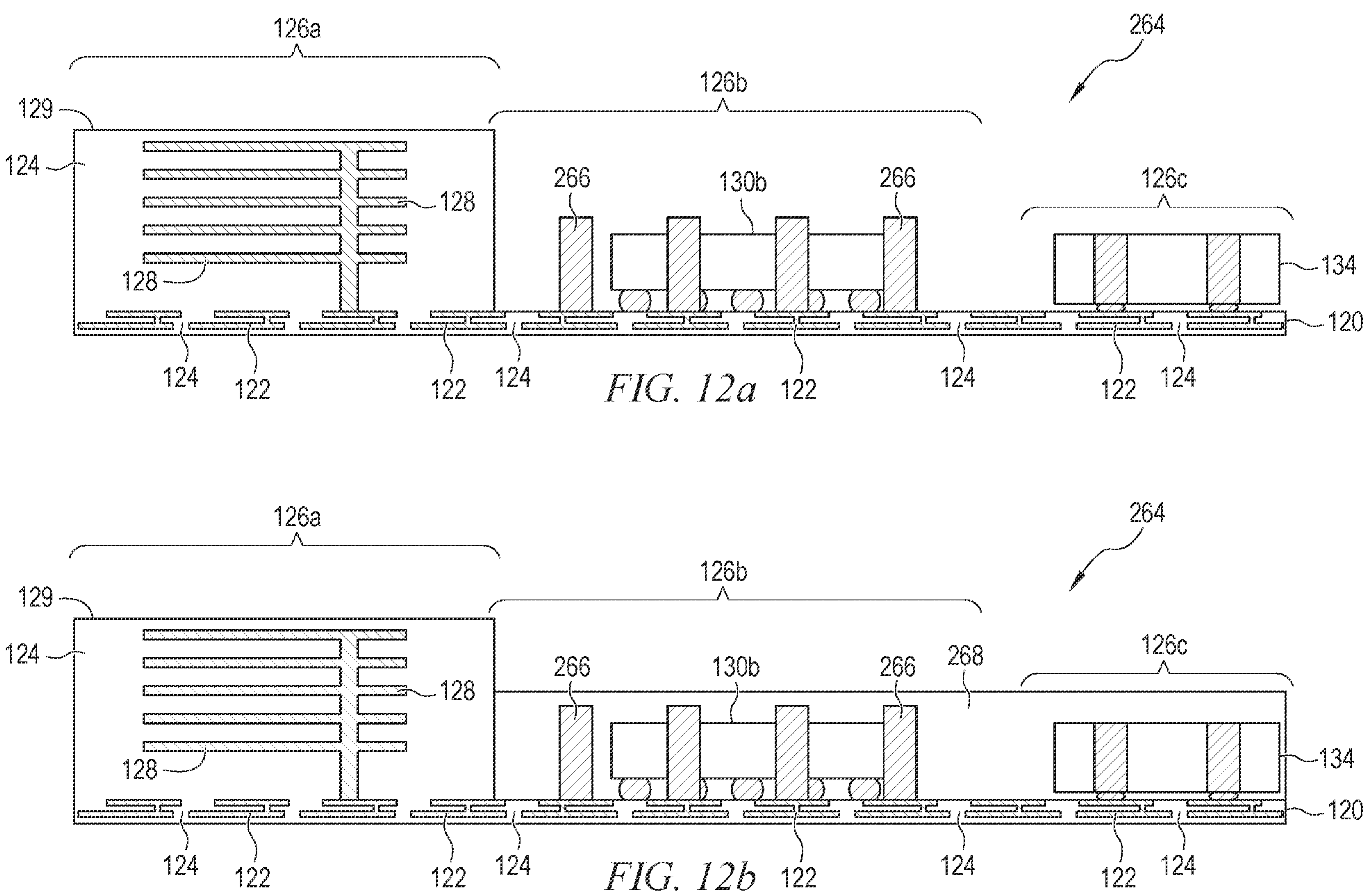
FIGS. 12*a*-12*j* illustrate a stacked die embodiment.

FIGS. 12*a*-12*j* illustrate forming a stacked die embodiment as package 264. In FIG. 12*a*, continuing from FIG. 2*a*, electrical component 130*b* and modular interconnect unit 134 are disposed on substrate 120 as described above. A plurality of conductive pillars 266 is also disposed or formed on substrate 120. Conductive pillars 266 can be pre-formed and disposed on contact pads of conductive layer 122 using a pick-and-place machine or grown by plating conductive material onto conductive layer 122. Any suitable conductive material can be used to form conductive pillars 266, such as those mentioned for conductive layer 122. Electrical components 130*a*, while not illustrated, can also be disposed on substrate 120 along with conductive pillars 266. Any suitable number and combination of electrical components can be mounted to substrate 120 in any embodiment.

In FIG. 12*b*, an encapsulant 268 is deposited over substrate 120, conductive pillars 266, electrical component 130*b*, and modular interconnect unit 134. Encapsulant 268 is deposited as described above for, e.g., encapsulant 150. Encapsulant 268 includes a planar upper surface instead of sloping up toward antenna block 126*a* as with encapsulant 150 above. Encapsulant 268 has a thickness over substrate 120 sufficient to fully cover conductive pillars 266, electrical component 130*b*, and modular interconnect unit 134. In some embodiments, film-assisted molding or another suitable process is utilized to leave conductive pillars 266, modular interconnect unit 134, or both coplanar to the top surface of encapsulant 268 and thereby exposed from the encapsulant. Conductive pillars 266, modular interconnect unit 134, and encapsulant 268 can all be made the same height with coplanar top surfaces.

Figures 12C, 12D:
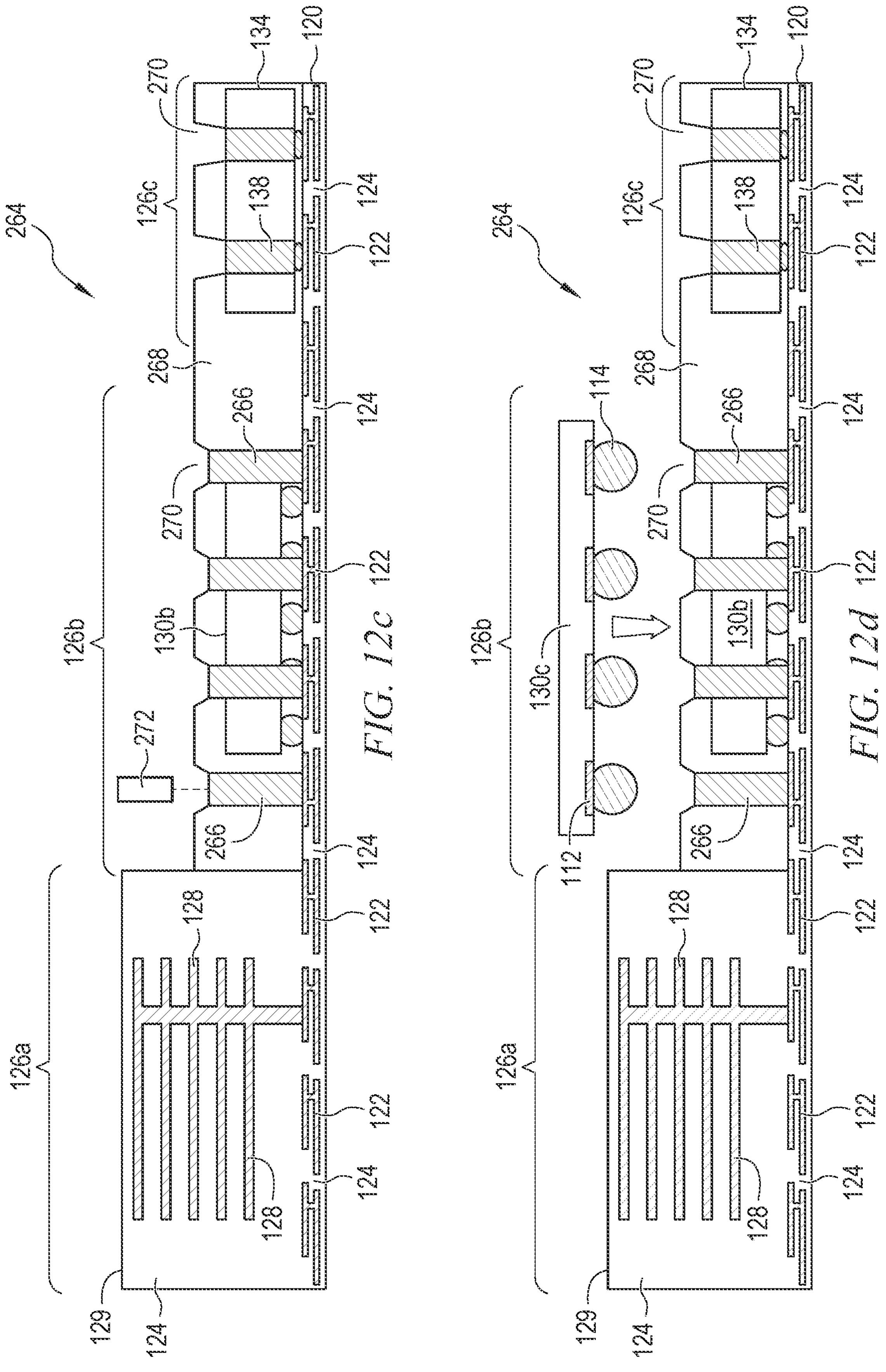

In embodiments where encapsulant 268 is formed to completely cover conductive pillars 266 and modular interconnect unit 134, openings 270 are formed to expose the conductive elements using a laser 272, or other suitable means, as shown in FIG. 12*c*. Conductive pillars 266 and conductive vias 138 are exposed in openings 270 for subsequent electrical interconnect.

Figures 12E, 12F:
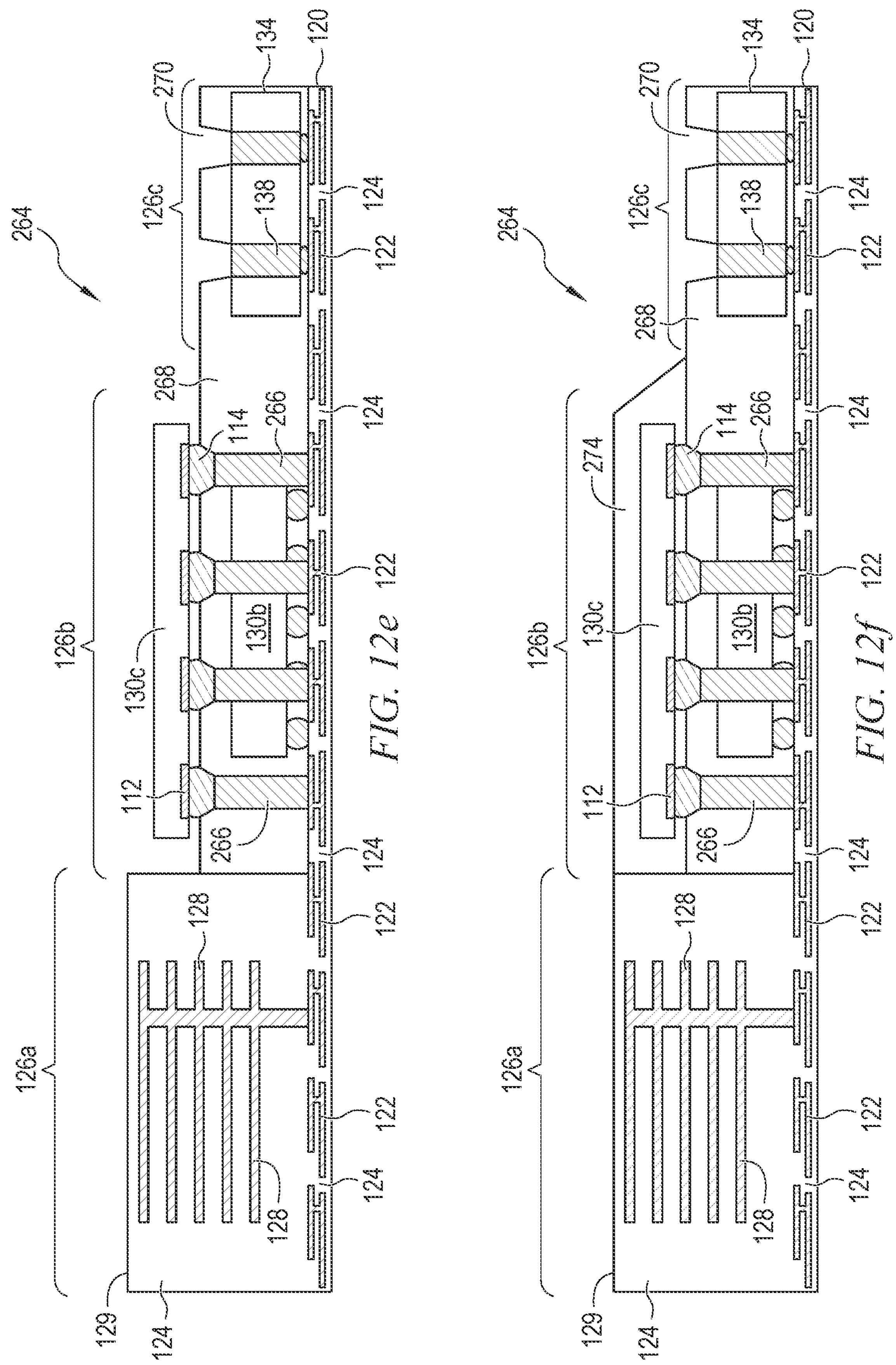

In FIG. 12*d*, an electrical component 130*c* is disposed over encapsulant 268 and mounted to conductive pillars 266 by reflowing conductive bumps 114 in FIG. 12*e*. Electrical component 130*c* can be similar to semiconductor die 104 and include any desired electrical functionality. Electrical component 130*c* is electrically coupled to substrate 120 by conductive pillars 266.

In FIG. 12*f*, a third encapsulant 274 is deposited over electrical component 130*c* as described above for other encapsulants, e.g., encapsulant 268. The top surface of encapsulant 274 is optionally made coplanar to the top surface 129 of antenna block 126*a*. Encapsulant 274 completely covers electrical component 130*c* and slopes down toward modular interconnect unit 134 without extending over the modular interconnect unit.

Figures 12G, 12H:
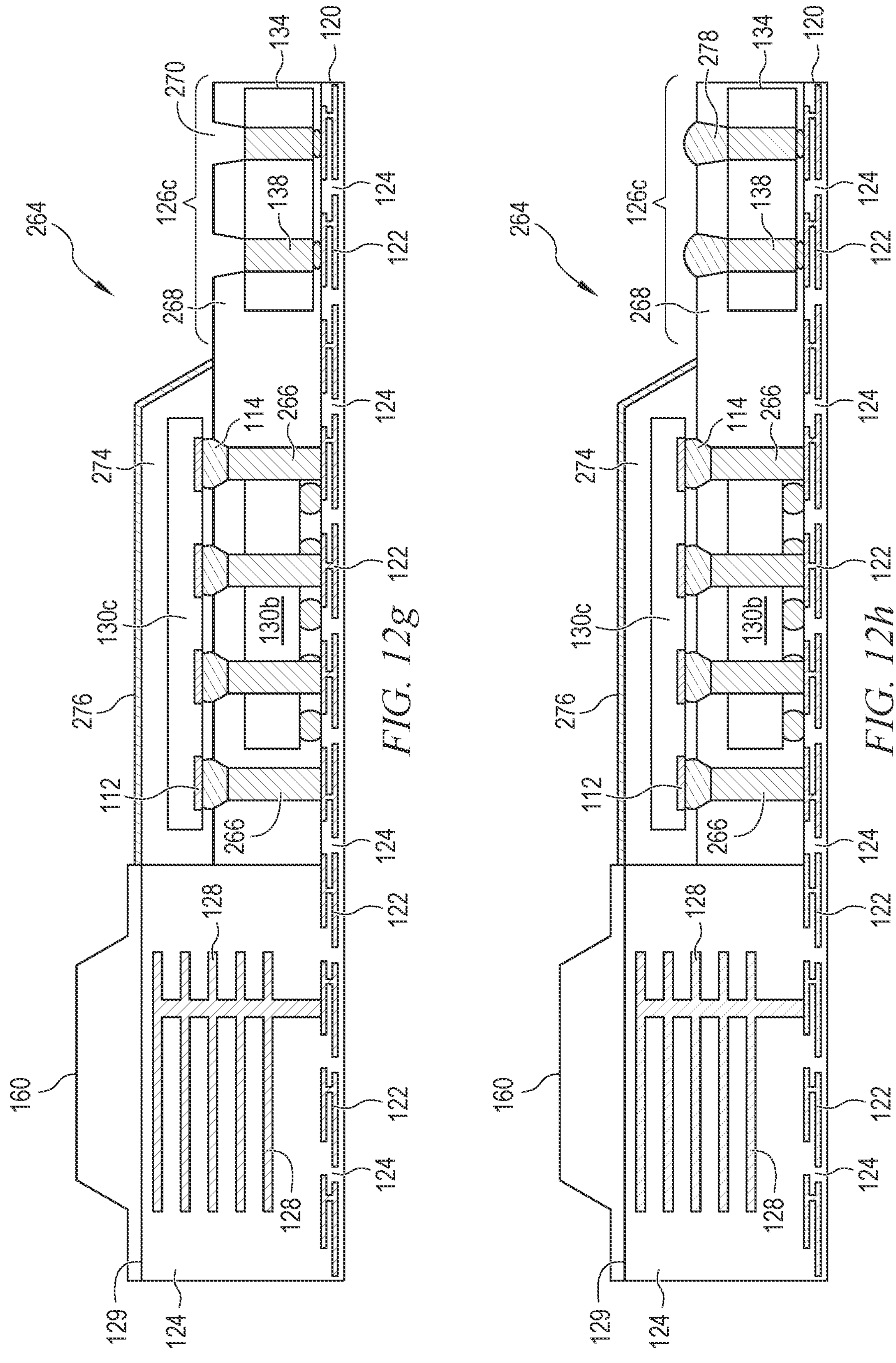
Figure 12I:
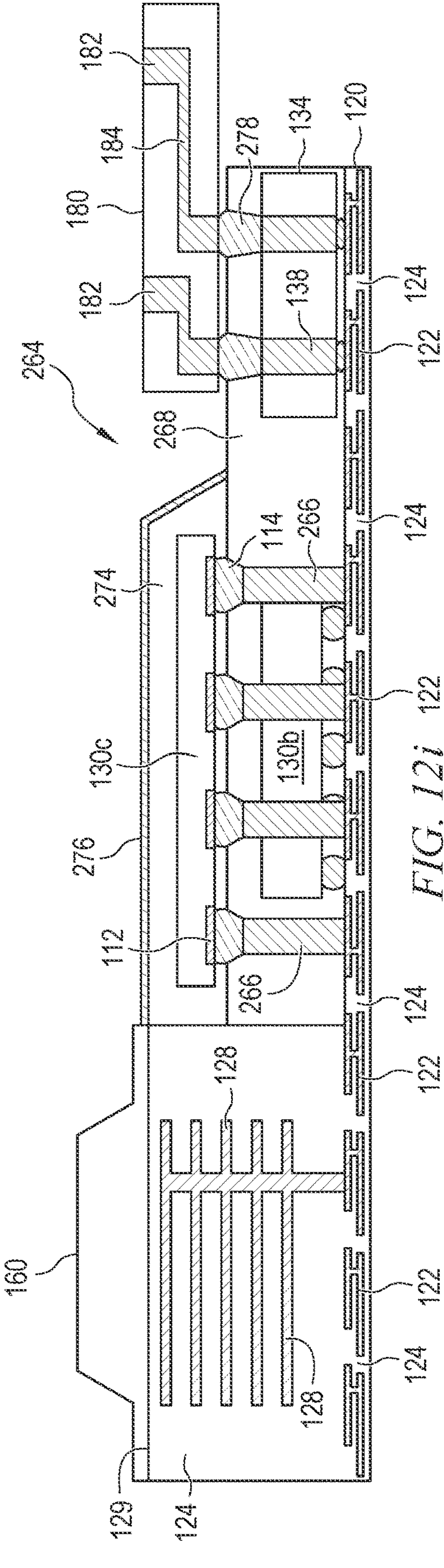

In FIG. 12*g*, high-k encapsulant 160 is deposited over antenna block 126*a* as described above. High-k block 202 can be used instead if desired. Shielding layer 276 is formed over encapsulant 274 as described above for shielding layer 170. In FIG. 12*h*, solder bumps 278 are disposed in openings 270 over modular interconnect unit 134 as described above for solder bumps 162. In FIG. 12*i*, connector 180 is disposed over and electrically connected to modular interconnect unit 134 through solder bumps 278.

Figure 12J:
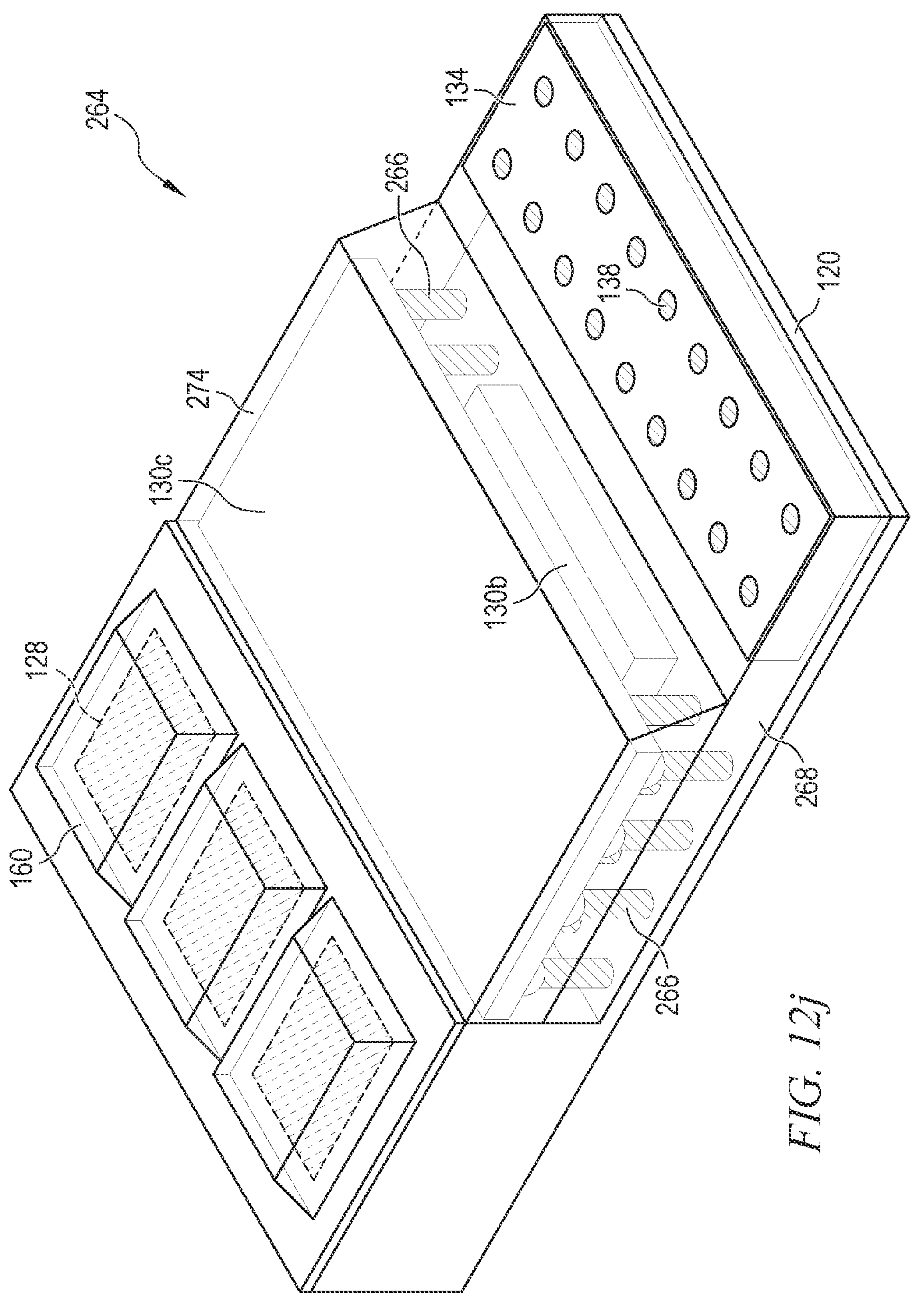

FIG. 12*j* illustrates a perspective view of package 264 showing electrical component 130*c* overlying electrical component 130*b*. Conductive pillars 266 are formed on two opposite sides of electrical component 130*b* and electrical component 130*c* extends outside the footprint of electrical component 130*b* on the same two sides to mount on the conductive pillars. Conductive pillars 266 can alternatively be formed adjacent to any one or more edges of electrical component 130*b* with electrical component 130*c* sized and positioned accordingly.

Figure 13:
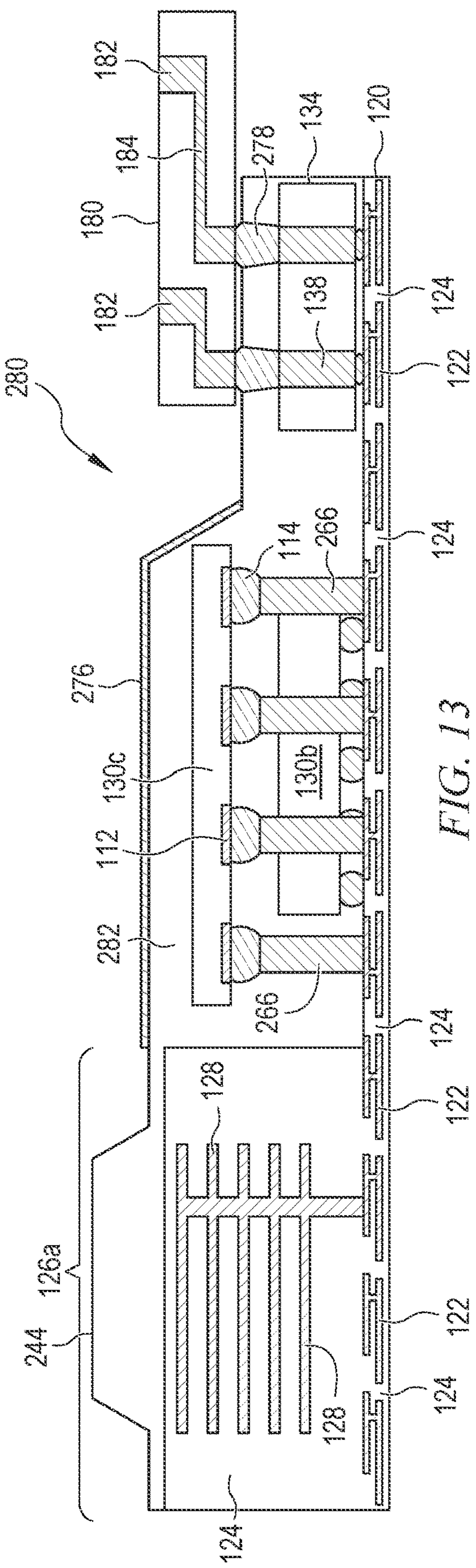
FIG. 13 illustrates the stacked die embodiment with unitary molding.

FIG. 13 shows an embodiment as package 280 with electrical component 130*c* stacked over electrical component 130*b* and a unitary encapsulant 282. Encapsulant 282 is deposited using the materials and processes described above for, e.g., encapsulant 150 or encapsulant 160. Encapsulant 282 is a single body of encapsulant deposited in a single step, after mounting electrical component 130*c* on conductive pillars 266, that extends over and around modular interconnect unit 134, electrical components 130, and antenna block 126*a*. Unitary encapsulant 282 is molded to form high-k encapsulant block 244 over antenna block 126*a*. Any above or below described embodiment can use a unitary encapsulant instead of encapsulating in multiple steps.

Figures 14A, 14B:
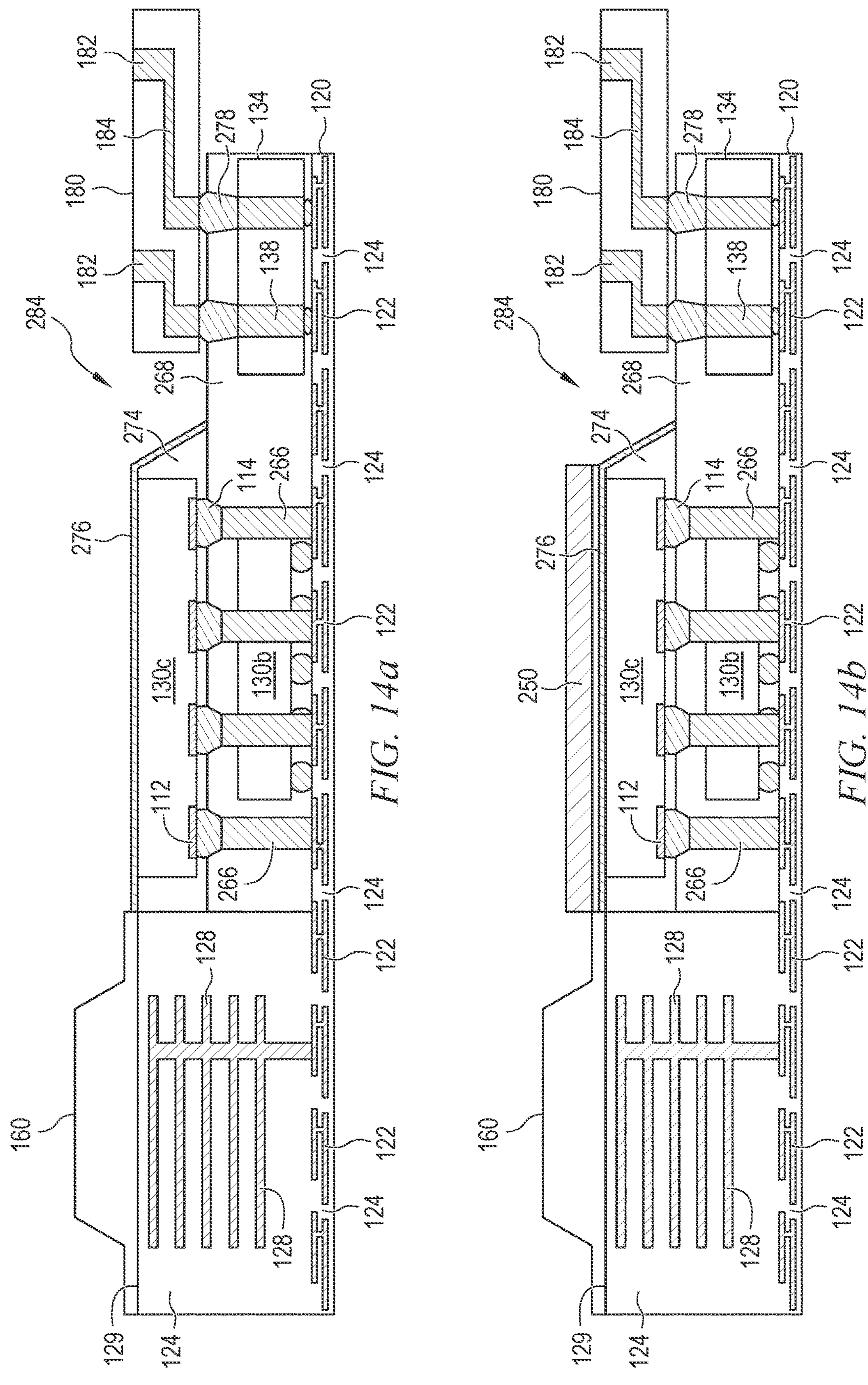
FIGS. 14*a* and 14*b* illustrate thermal management options for the stacked die embodiments.

FIGS. 14*a* and 14*b* illustrate forming a semiconductor package 284 with electrical component 130*c* exposed from encapsulant 274 so that shielding layer 276 can be formed directly on electrical component 130*c*. Package 284 is formed as described for package 264 in FIGS. 12*a*-12*j*, except that the semiconductor die of electrical component 130*c* is left thicker so that a height of the semiconductor die is equivalent to the thickness of encapsulant 274. After encapsulant 274 is deposited, a top surface of the encapsulant is coplanar to a top surface of electrical component 130*c*. In other embodiments, encapsulant 274 and electrical component 130*c* are backgrinded after depositing the encapsulant to make the top surfaces coplanar.

Having the top surface of electrical component 130*c* exposed allows shielding layer 276 to be formed directly on the electrical component, thereby increasing thermal transfer. Adding lid 250 in FIG. 14*b*, and potentially heatsink 258 or heat pipe 262, further increases thermal capacity while retaining the increased rate of thermal transfer provided by shielding layer 276 being formed directly on electrical component 130*c*.

Figures 15, 16:
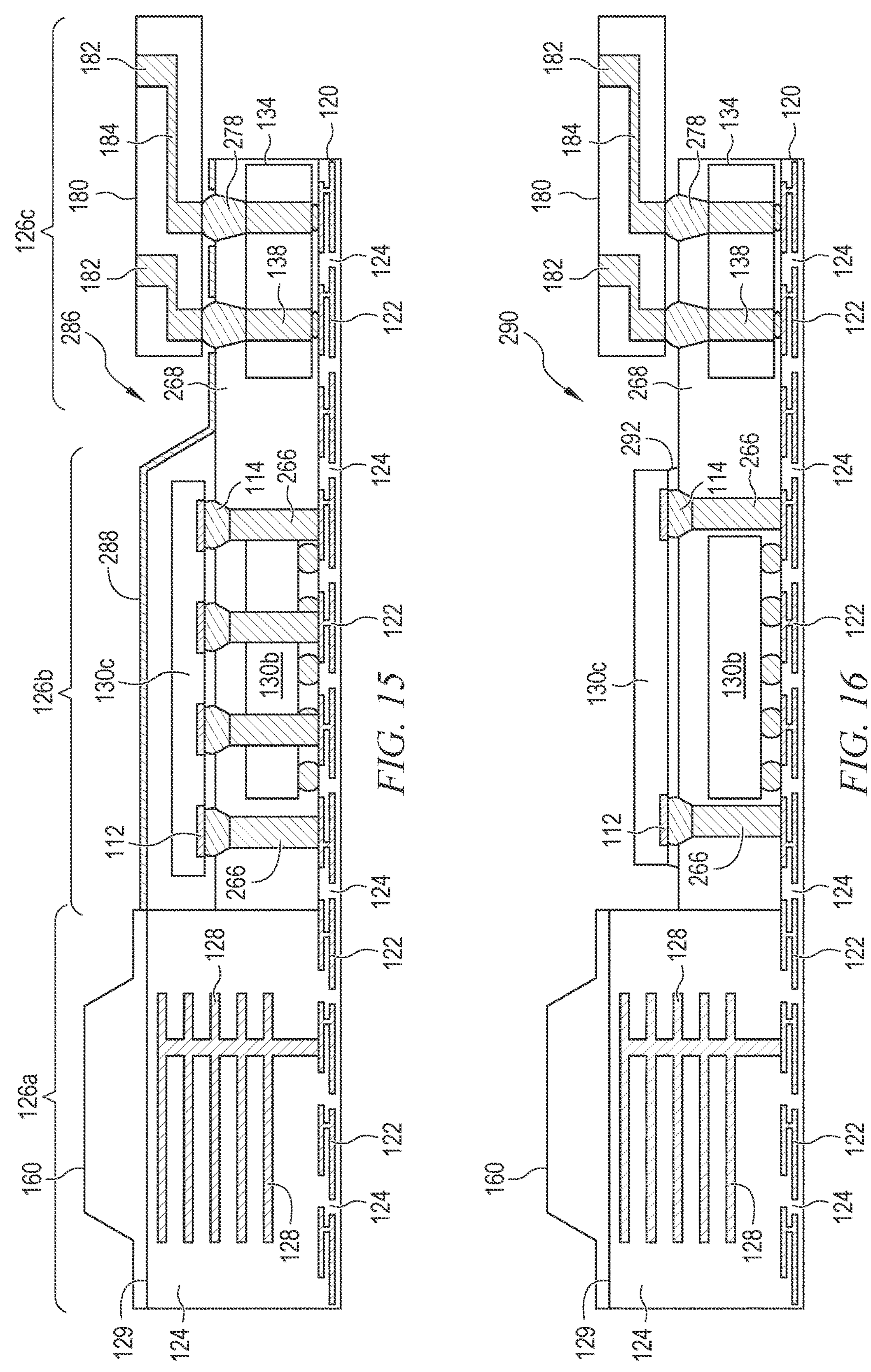
FIG. 15 illustrate an additional shielding layer embodiment.
FIG. 16 illustrates an additional stacked die embodiment.

FIG. 15 shows a semiconductor package 286 with shielding layer 288 extending over interconnect area 126*c* in addition to component area 126*b*. Shielding layer 288 is formed as with the above shielding layers, e.g., shielding layer 170, but is not masked over the entirety of interconnect area 126*c*. In one embodiment, shielding layer 288 is formed totally covering interconnect area 126*c* and then removed over and around solder bumps 278 using, e.g., laser ablation to remove the undesired electrical connections. In other embodiments, the formation of shielding layer 288 is masked over and around solder bumps 278 but not over the entirety of interconnect area 126*c* as in the previous embodiments. Shielding layer 288 remains extending to one or more solder bumps 278 to couple the shielding layer to ground in some embodiments. Any of the embodiments described above or below can have their shielding layers extending over interconnect area 126*c* in addition to component area 126*b*.

FIG. 16 illustrates an embodiment as semiconductor package 290 with electrical component 130*c* remaining exposed and an underfill 292 used instead of encapsulant completely covering the electrical component. Lid 250 can still be applied directly to electrical component 130*c* with either heatsink 258 or heat pipe 262 as optional additions. In other embodiments, heatsink 258 or heat pipe 262 are used without lid 250. Package 290 has conductive pillars 266 formed to the left and right of electrical component 130*b* in the view of FIG. 16, rather than toward and away from the viewer as in FIG. 15. As mentioned above, conductive pillars 266 can be formed adjacent to any one or more edges of electrical component 130*b*.

Figures 17, 18:
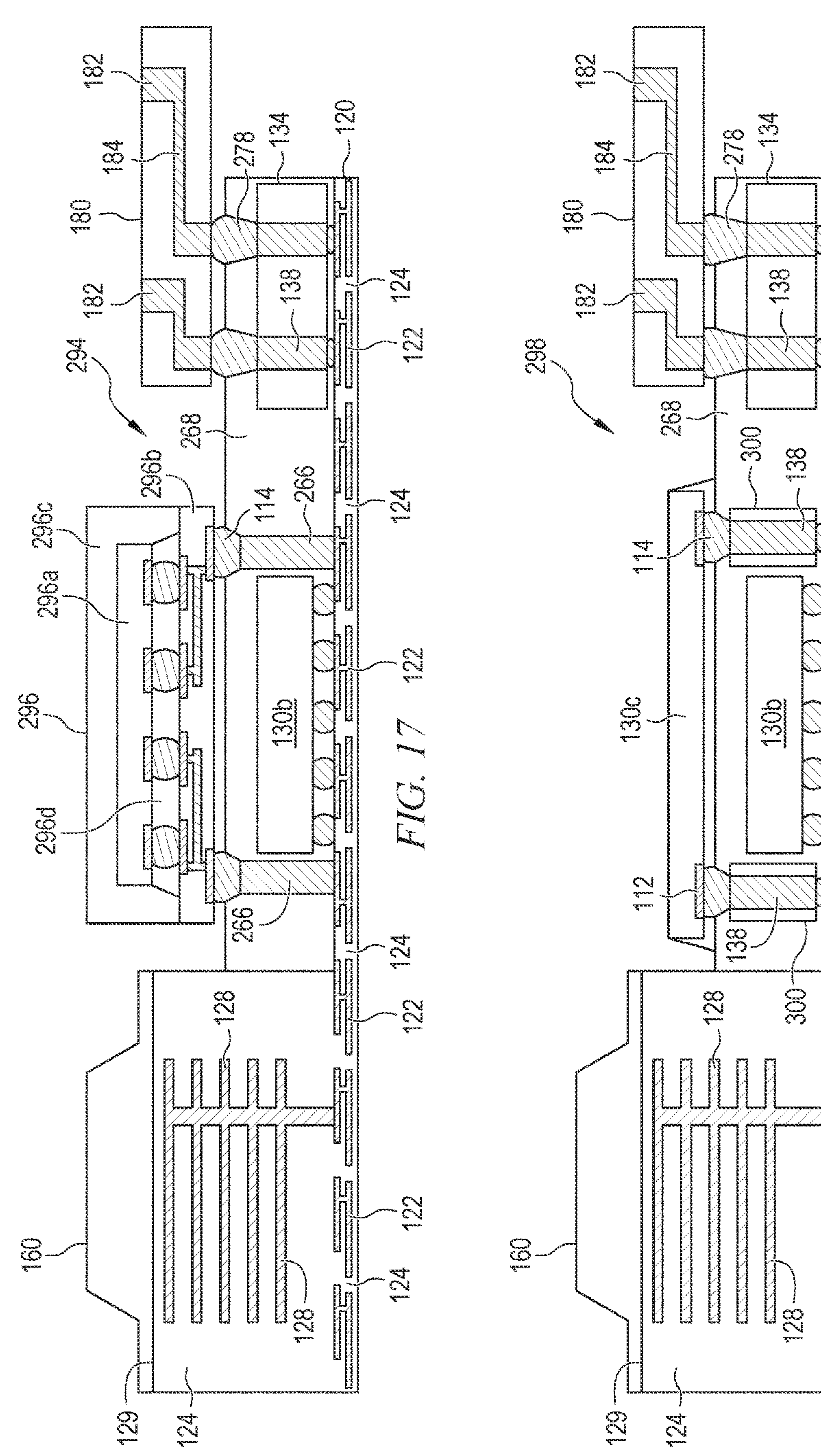
FIG. 17 illustrates a stacked package embodiment.
FIG. 18 illustrates a stacked embodiment utilizing modular interconnect structures.

FIG. 17 shows package 294 with a stacked subpackage 296 instead of a bare die. Subpackage 296 has another die 296*a* with its own packaging, including a substrate 296*b*, encapsulant 296*c*, and underfill 296*d*. Semiconductor die 296*a* is separately packaged before being disposed and mounted over pillars 266 as described above for electrical component 130*c*. Any type of semiconductor package can be mounted as a subpackage of package 294. Another underfill can be deposited between package 296 and encapsulant 268 for physical support if desired.

FIG. 18 illustrates a package 298 with modular interconnect units 300 used instead of conductive pillars 266. Modular interconnect units 300 are similar to modular interconnect units 134, having at least an insulating core and a conductive via 138 formed through the insulating core. In some embodiments, additional conductive or insulating layers can be formed over top and bottom surfaces of modular interconnect units 134 and 300. Any embodiment above or below can have conductive pillars 266 replaced by modular interconnect units 300.

Figure 19:
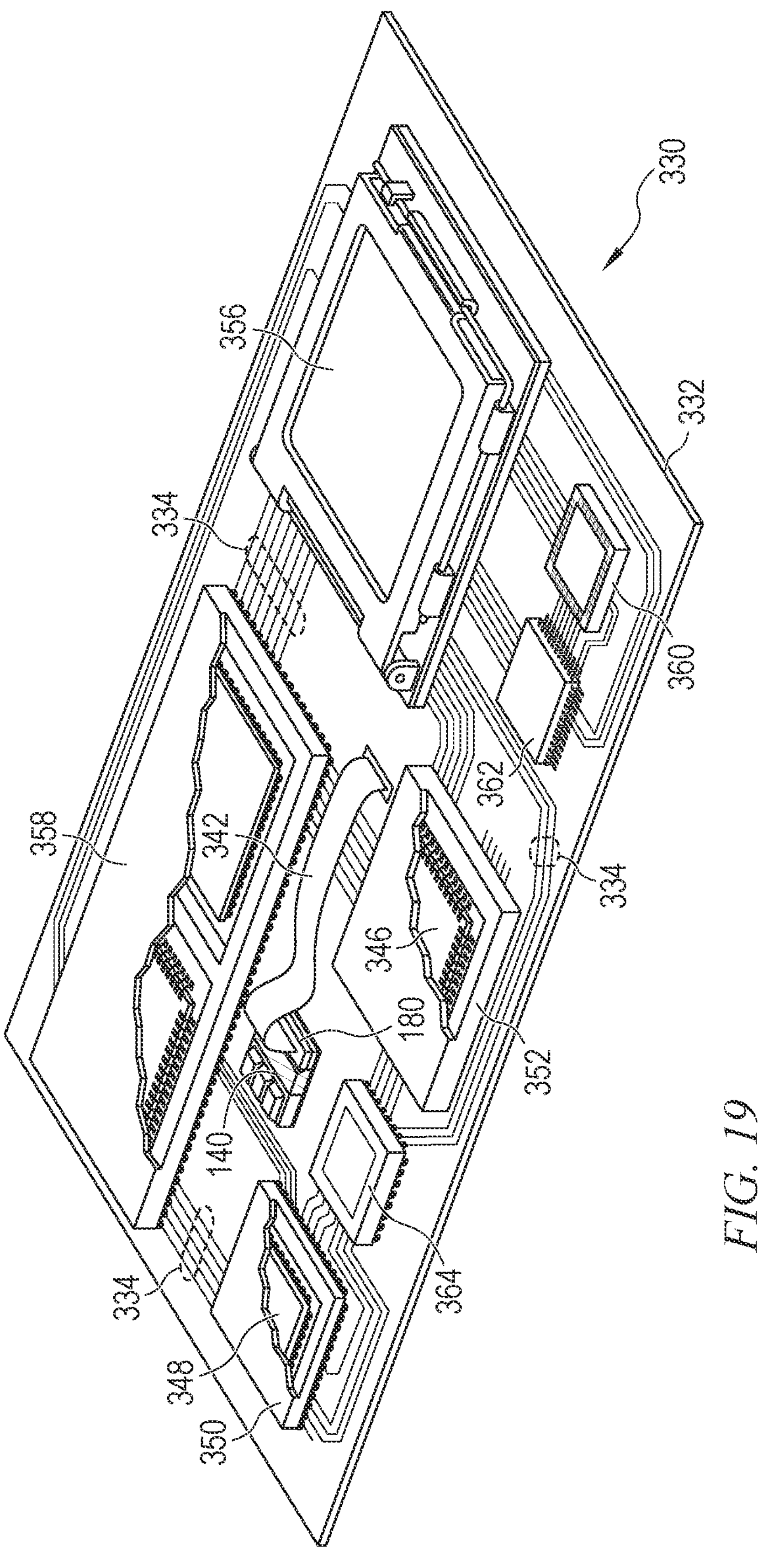
FIG. 19 illustrates an electronic device with different types of packages disposed on a printed circuit board (PCB).

FIG. 19 illustrates integrating the above-described semiconductor packages, e.g., semiconductor package 140, into a larger electronic device 330. Electronic device 330 includes PCB 332 with a plurality of semiconductor packages mounted on a surface of the PCB, including semiconductor package 140. In one embodiment, electronic device 330 is a mobile phone and PCB 332 is the main board or a sub assembly of the phone. Semiconductor package 140 is mounted using a liquid adhesive, adhesive tape, or other suitable means to attach the package to PCB 332. A ribbon cable 342 has a connector that snaps into or otherwise interfaces with connector 180. Ribbon cable 342 routes electrical signals to another connector on PCB 332 or to another package mounted to the PCB. Electrical components 130 are electrically coupled to PCB 332 through substrate 120, connector 180, and ribbon cable 342.

Electronic device 330 can have one type of semiconductor package, or multiple types of semiconductor packages, depending on the application. Electronic device 330 can be a stand-alone system that uses the semiconductor packages to perform one or more electrical functions. Alternatively, electronic device 330 can be a subcomponent of a larger system. For example, electronic device 330 can be part of a tablet computer, cellular phone, digital camera, communication system, or other electronic device. Electronic device 330 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 19, PCB 332 provides a general substrate for structural support and electrical interconnection of the semiconductor packages mounted on the PCB. Conductive signal traces 334 are formed over a surface or within layers of PCB 332 using evaporation, electrolytic plating, electroless plating, screen printing, or other suitable metal deposition process. Signal traces 334 provide for electrical communication between the semiconductor packages, mounted components, and other external systems or components. Traces 334 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 332. In other embodiments, a semiconductor device may only have the first level packaging where the die is mechanically and electrically mounted directly to PCB 332.

For the purpose of illustration, several types of first level packaging, including bond wire package 346 and flipchip 348, are shown on PCB 332. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 332 along with semiconductor package 140. Conductive traces 334 electrically couple the various packages and components disposed on PCB 332 to semiconductor package 140, giving use of electrical components 130 to other components on the PCB.

Depending upon the system requirements, any combination of semiconductor packages, configured with any combination of first and second level packaging styles, as well as other electronic components, can be connected to PCB 332. In some embodiments, electronic device 330 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
- a substrate including an antenna formed in a first area of the substrate, wherein a thickness of the first area of the substrate is greater than a thickness of a second area of the substrate and also greater than a thickness of a third area of the substrate, and wherein the first area of the substrate is formed thicker than the second area and third area by successively forming upper conductive layers and upper insulating layers over the first area directly on lower conductive layers and lower insulating layers that extend over the first area, the second area, and the third area;
- a first electrical component disposed over the second area of the substrate;
- a conductive pillar disposed on the substrate adjacent to the first electrical component;
- a second electrical component disposed on the conductive pillar and over the first electrical component;
- an interconnect structure disposed over the third area of the substrate;
- a first encapsulant deposited over the first electrical component and interconnect structure;
- a second encapsulant deposited over the second electrical component; and
- a third encapsulant disposed over the antenna, wherein the third encapsulant includes a higher dielectric constant than the first encapsulant and second encapsulant.

2. The semiconductor device of claim 1, wherein the second electrical component is part of a subpackage.

3. The semiconductor device of claim 1, further including a connector mounted over the interconnect structure.

4. The semiconductor device of claim 3, further including a shielding layer formed over the first encapsulant and second encapsulant, wherein the shielding layer extends between the connector and interconnect structure.

5. The semiconductor device of claim 1, further including a lid disposed over the second electrical component.

6. The semiconductor device of claim 5, further including a heatsink or heat pipe disposed over the lid.

7. A semiconductor device, comprising:
- a substrate including an antenna formed in or on a first area of the substrate, wherein the first area of the substrate has a first thickness greater than a second thickness of a second area of the substrate;
- a first electrical component disposed over the second area of the substrate;
- a second electrical component disposed over the first electrical component; and
- a first encapsulant disposed over the antenna.

8. The semiconductor device of claim 7, further including a second encapsulant disposed over the second electrical component, wherein the first encapsulant has a higher dielectric constant than the second encapsulant.

9. The semiconductor device of claim 7, wherein the first encapsulant extends to the first electrical component and second electrical component.

10. The semiconductor device of claim 7, further including an interconnect structure disposed adjacent to the first electrical component between the second electrical component and substrate.

11. The semiconductor device of claim 7, further including a lid disposed over the second electrical component.

12. The semiconductor device of claim 7, further including an underfill disposed between the first electrical component and second electrical component.

13. A method of making a semiconductor device, comprising:
- providing a substrate including an antenna formed in a first area of the substrate, wherein a thickness of the first area of the substrate is greater than a thickness of a second area of the substrate and also greater than a thickness of a third area of the substrate, and wherein the first area of the substrate is formed thicker than the second area and third area by successively forming upper conductive layers and upper insulating layers over the first area directly on lower conductive layers and lower insulating layers that extend over the first area, the second area, and the third area;
- disposing a first electrical component over a second area of the substrate;
- disposing a conductive pillar on the substrate adjacent to the first electrical component;
- disposing an interconnect structure over a third area of the substrate;

depositing a first encapsulant over the first electrical component and interconnect structure;

disposing a second electrical component on the conductive pillar and over the first electrical component;

depositing a second encapsulant over the second electrical component; and disposing a third encapsulant over the antenna, wherein the third encapsulant includes a higher dielectric constant than the first encapsulant and second encapsulant.

14. The method of claim 13, wherein the second electrical component is part of a subpackage.

15. The method of claim 13, further including mounting a connector over the interconnect structure.

16. The method of claim 15, further including forming a shielding layer over the first encapsulant and second encapsulant.

17. The method of claim 13, further including disposing a lid over the second electrical component.

18. The method of claim 17, further including disposing a heatsink or heat pipe over the lid.

19. A method of making a semiconductor device, comprising:

providing a substrate including an antenna formed in or on a first area of the substrate, wherein the first area of the substrate has a first thickness greater than a second thickness of a second area of the substrate;

disposing a first electrical component over the second area of the substrate;

disposing a second electrical component over the first electrical component; and disposing a first encapsulant over the antenna.

20. The method of claim 19, further including depositing a second encapsulant over the second electrical component, wherein the first encapsulant has a higher dielectric constant than the second encapsulant.

21. The method of claim 19, further including depositing the first encapsulant to extend to the first electrical component and second electrical component.

22. The method of claim 19, further including disposing an interconnect structure adjacent to the first electrical component between the second electrical component and substrate.

23. The method of claim 19, further including disposing a lid over the second electrical component.

24. The method of claim 19, further including disposing an underfill between the first electrical component and second electrical component.

* * * * *